(12) United States Patent
Watkins et al.

(10) Patent No.: US 12,092,953 B2
(45) Date of Patent: Sep. 17, 2024

(54) PATTERNING OF NANOSTRUCTURES USING IMPRINT LITHOGRAPHY

(71) Applicant: University of Massachusetts, Boston, MA (US)

(72) Inventors: James J. Watkins, South Hadley, MA (US); Rohit Kothari, Boise, ID (US)

(73) Assignee: University of Massachusetts, Boston, MA (US)

( * ) Notice: Subject to any disclaimer, the term of this patent is extended or adjusted under 35 U.S.C. 154(b) by 632 days.

(21) Appl. No.: 16/315,442

(22) PCT Filed: Jun. 26, 2017

(86) PCT No.: PCT/US2017/039294
§ 371 (c)(1),
(2) Date: Jan. 4, 2019

(87) PCT Pub. No.: WO2018/009363
PCT Pub. Date: Jan. 11, 2018

(65) Prior Publication Data
US 2019/0243237 A1 Aug. 8, 2019

Related U.S. Application Data

(60) Provisional application No. 62/359,967, filed on Jul. 8, 2016.

(51) Int. Cl.
*G03F 7/00* (2006.01)
*B29C 71/02* (2006.01)
(Continued)

(52) U.S. Cl.
CPC ............ *G03F 7/0002* (2013.01); *B29C 71/02* (2013.01); *B32B 3/10* (2013.01); *B32B 5/16* (2013.01);
(Continued)

(58) Field of Classification Search
CPC ............ G03F 7/0002; G03F 1/00; B32B 3/10
See application file for complete search history.

(56) References Cited

U.S. PATENT DOCUMENTS 6,039,897 A * 3/2000 Lochhead ............... B29C 33/42
264/1.24
6,900,126 B2 * 5/2005 Carter ..................... B82Y 10/00
257/E21.582

(Continued)

FOREIGN PATENT DOCUMENTS

CN 101477304 A 7/2009
CN 101581879 A 11/2009
(Continued)

OTHER PUBLICATIONS

"International Application Serial No. PCT/US2017/039294, International Search Report mailed Sep. 25, 2017", 2 pgs.
(Continued)

*Primary Examiner* — Xiao S Zhao
*Assistant Examiner* — Nicholas J Chidiac
(74) *Attorney, Agent, or Firm* — Schwegman Lundberg & Woessner, P.A.

(57) ABSTRACT

Various embodiments disclosed relate to methods of manufacturing a textured surface comprising disposing a nanoparticulate ink on a substrate.

20 Claims, 13 Drawing Sheets

(51) Int. Cl.
| | |
|---|---|
| *B32B 3/10* | (2006.01) |
| *B32B 5/16* | (2006.01) |
| *B32B 5/30* | (2006.01) |
| *C09D 11/033* | (2014.01) |
| *C09D 11/037* | (2014.01) |
| *C09D 11/52* | (2014.01) |
| *C23C 18/06* | (2006.01) |
| *C23C 18/12* | (2006.01) |
| *G03F 1/00* | (2012.01) |
| *H01L 21/02* | (2006.01) |

(52) U.S. Cl.
CPC .............. *B32B 5/30* (2013.01); *C09D 11/033* (2013.01); *C09D 11/037* (2013.01); *C09D 11/52* (2013.01); *C23C 18/06* (2013.01); *C23C 18/1254* (2013.01); *C23C 18/1283* (2013.01); *G03F 1/00* (2013.01); *H01L 21/02288* (2013.01); *B29C 2071/022* (2013.01)

(56) References Cited

U.S. PATENT DOCUMENTS

| | | | | |
|---|---|---|---|---|
| 7,491,422 | B2* | 2/2009 | Zhang | B81C 1/0046 |
| | | | | 250/307 |
| 8,344,039 | B2* | 1/2013 | Hanabata | G03F 7/027 |
| | | | | 522/167 |
| 9,298,089 | B1* | 3/2016 | Hernandez | G03F 7/028 |
| 10,204,782 | B2* | 2/2019 | Maes | H01L 21/0228 |
| 10,741,394 | B2* | 8/2020 | Maes | G03F 7/0002 |
| 10,946,625 | B2* | 3/2021 | Verschuuren | C08L 83/04 |
| 11,133,118 | B2* | 9/2021 | Watkins | H01M 8/124 |
| 11,163,230 | B2* | 11/2021 | Verschuuren | G03F 7/0002 |
| 11,282,616 | B2* | 3/2022 | Watkins | G02B 1/118 |
| 2004/0097072 | A1* | 5/2004 | Carter | B82Y 10/00 |
| | | | | 257/E21.582 |
| 2005/0255237 | A1* | 11/2005 | Zhang | G03F 7/2049 |
| | | | | 427/180 |
| 2008/0182072 | A1 | 7/2008 | Choi et al. | |
| 2008/0308971 | A1* | 12/2008 | Liu | B82Y 10/00 |
| | | | | 264/293 |
| 2010/0109201 | A1 | 5/2010 | Fletcher et al. | |
| 2010/0109203 | A1 | 5/2010 | Chen et al. | |
| 2010/0286300 | A1* | 11/2010 | Hanabata | C08F 2/44 |
| | | | | 522/83 |
| 2011/0064925 | A1 | 3/2011 | Van et al. | |
| 2014/0072720 | A1* | 3/2014 | Watkins | H01B 1/08 |
| | | | | 252/521.1 |
| 2015/0140837 | A1 | 5/2015 | Chemin et al. | |
| 2015/0283846 | A1 | 10/2015 | Trexler et al. | |
| 2015/0291815 | A1* | 10/2015 | Verschuuren | B82Y 40/00 |
| | | | | 428/195.1 |
| 2016/0109799 | A1* | 4/2016 | Hernandez | G03F 7/028 |
| | | | | 430/281.1 |
| 2017/0301542 | A1* | 10/2017 | Maes | G03F 7/0002 |
| 2018/0305567 | A1* | 10/2018 | Verschuuren | G03F 7/0002 |
| 2019/0157086 | A1* | 5/2019 | Maes | H01L 21/0337 |
| 2020/0020461 | A1* | 1/2020 | Watkins | G02B 1/118 |
| 2021/0079167 | A1* | 3/2021 | Verschuuren | B29C 33/3842 |
| 2022/0013247 | A1* | 1/2022 | Watkins | G02B 1/118 |

FOREIGN PATENT DOCUMENTS

| | | |
|---|---|---|
| CN | 102135728 A | 7/2011 |
| CN | 103328176 A | 9/2013 |
| CN | 109414726 | 3/2019 |
| EP | 2904058 A1 | 8/2015 |
| KR | 100946249 B1 | 3/2010 |
| KR | 101017403 B1 | 2/2011 |
| WO | WO-2018009363 A1 | 1/2018 |

OTHER PUBLICATIONS

"International Application Serial No. PCT/US2017/039294, Written Opinion mailed Sep. 25, 2017", 5 pgs.

"European Application Serial No. 17824706.0, Extended European Search Report mailed May 28, 2019", 8 pgs.

"Chinese Application Serial No. 201780042278.7, Voluntary Amendment filed Jun. 24, 2019", w/ English Claims, 8 pgs.

"European Application Serial No. 17824706.0, Response filed Dec. 9, 2019 to Extended European Search Report mailed May 28, 2019", 14 pgs.

"Chinese Application Serial No. 201780042278.7, Office Action mailed Mar. 23, 2021", 23 pgs.

"Chinese Application Serial No. 201780042278.7, Office Action mailed Jan. 10, 2022", with English translation, 20 pages.

"European Application Serial No. 17824706.0, Response Filed Mar. 24, 2022 to Communication Pursuant to Article 94(3) EPC mailed Nov. 16, 2021", 14 pages.

"Chinese Application Serial No. 201780042278.7, Response filed Oct. 8, 2021 to Office Action mailed Mar. 23, 2021", w/ English claims, 15 pgs.

"European Application Serial No. 17824706.0, Communication Pursuant to Article 94(3) EPC mailed Nov. 16, 2021", 9 pgs.

Beaulieu, M, et al., "Large-Area Printing of Optical Gratings and 3D Photonic Crystals Using Solution-Processable Nanoparticle/Polymer Composites", Acs Photonics 1, (Aug. 11, 2014), 799-805.

Hongbo, Lan, et al., "UV-Nanoimprint Lithography: Structure, Materials and Fabrication of Flexible Molds", Journal of Nanoscience and Nanotechnology, vol. 13, No. 5, (May 1, 2013), 3145-3172.

* cited by examiner

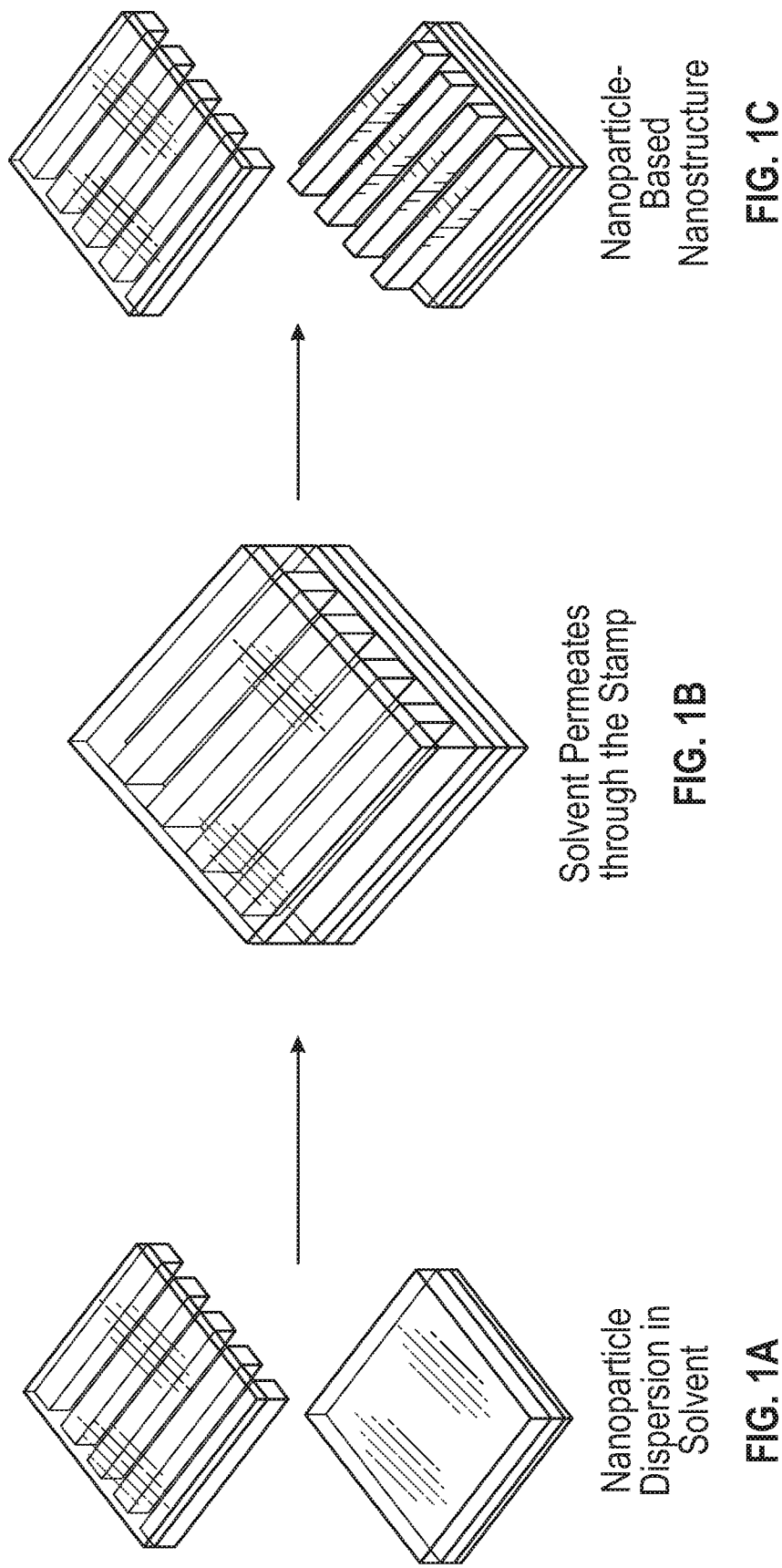

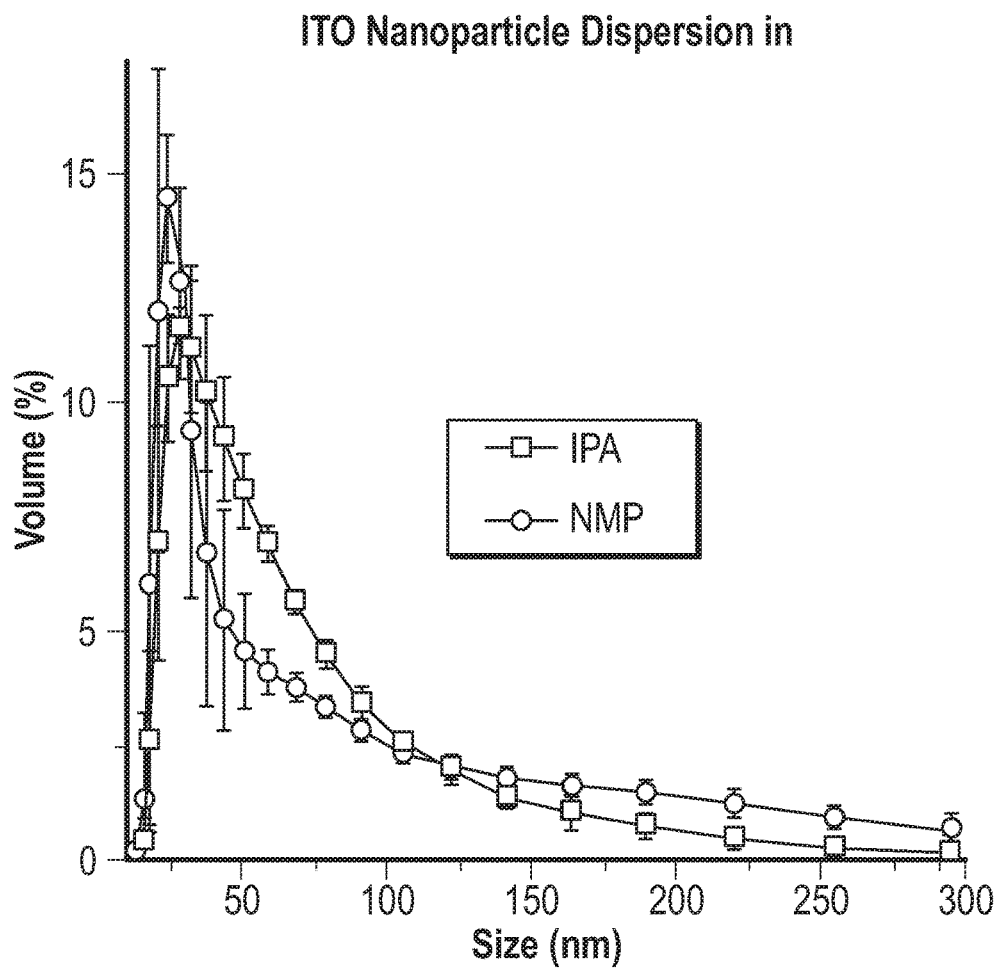
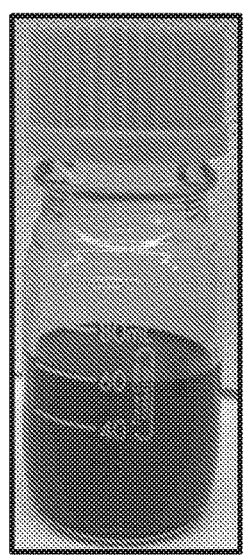 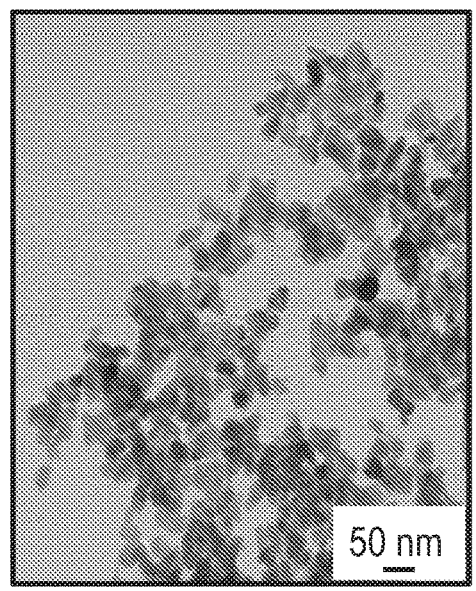
FIG. 2A
FIG. 2B        FIG. 2C

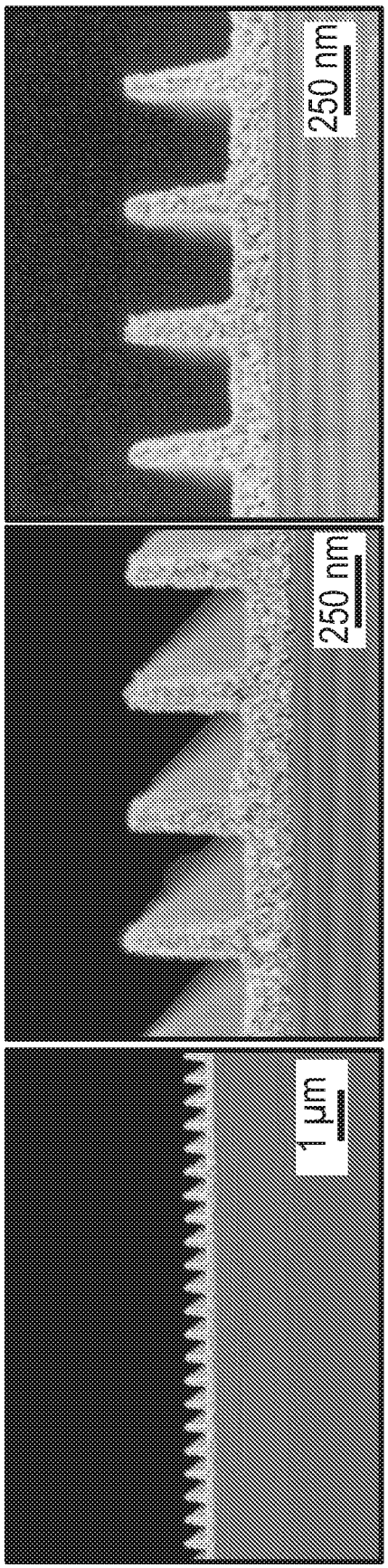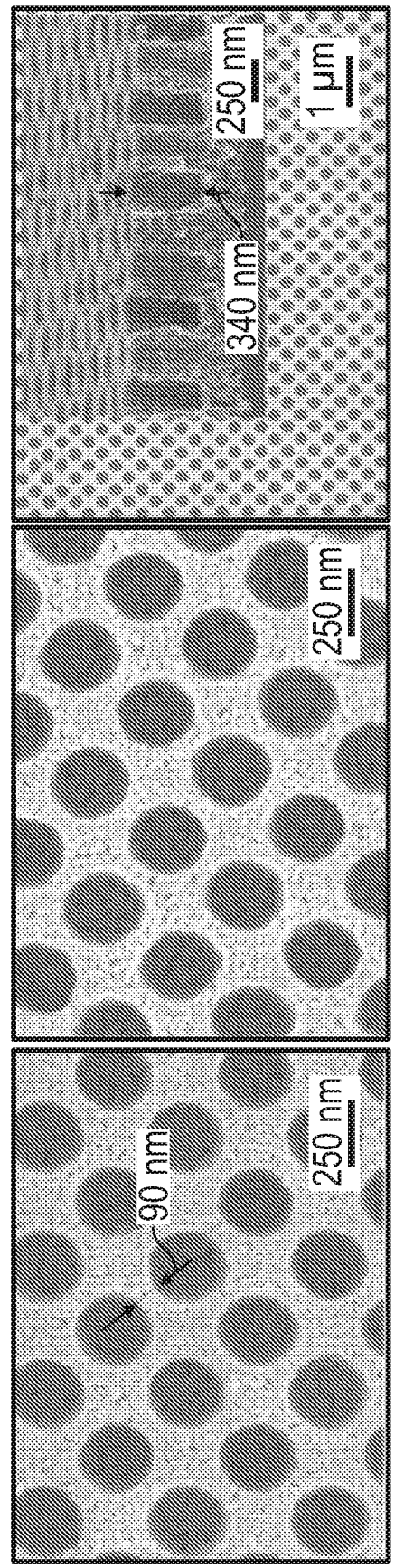
FIG. 3A  FIG. 3B  FIG. 3C  FIG. 3D  FIG. 3E  FIG. 3F

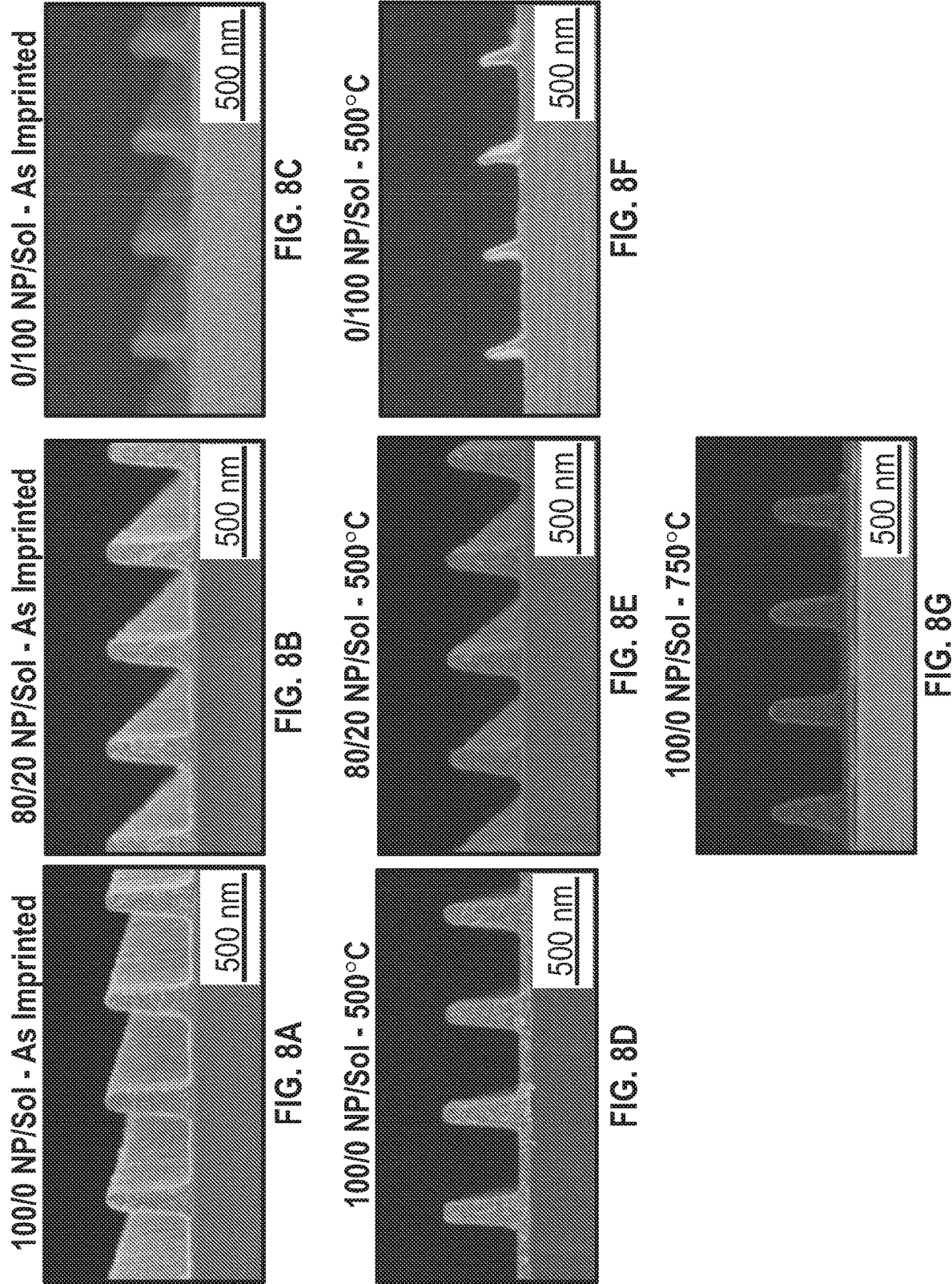

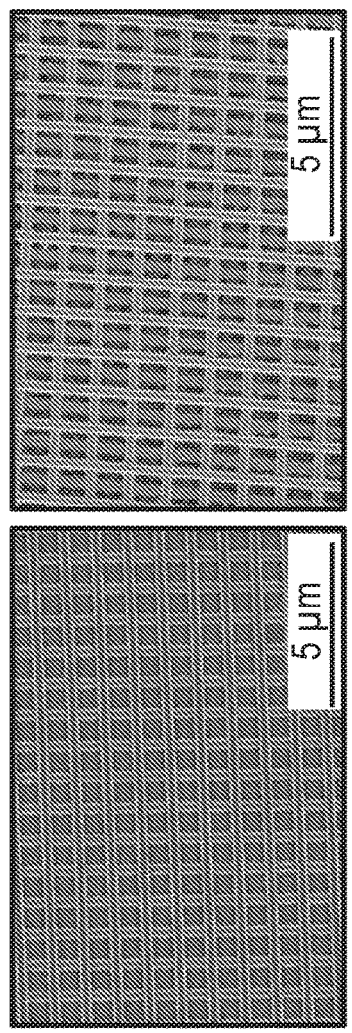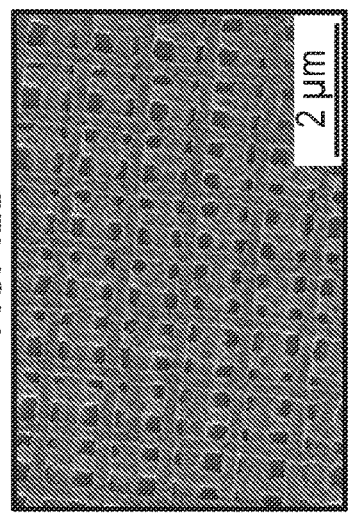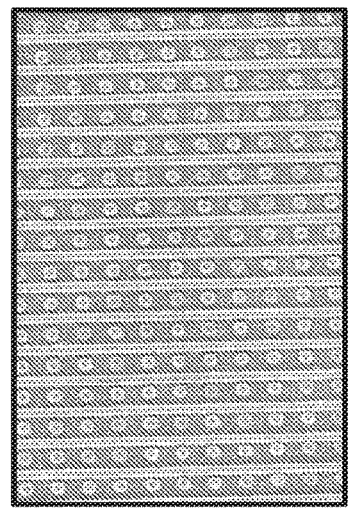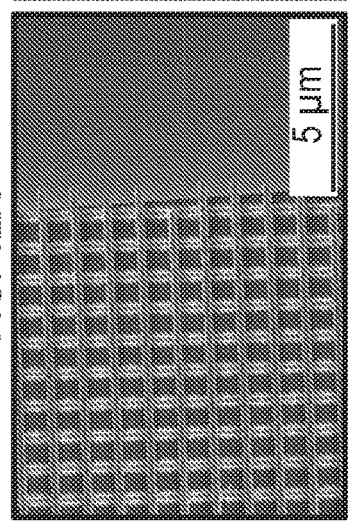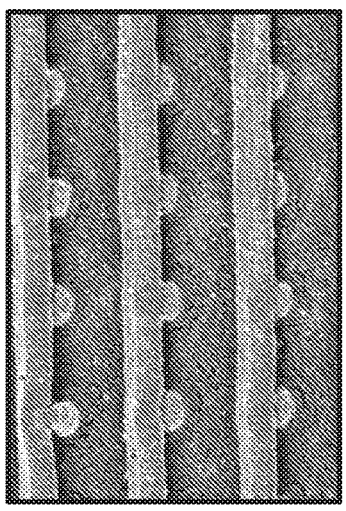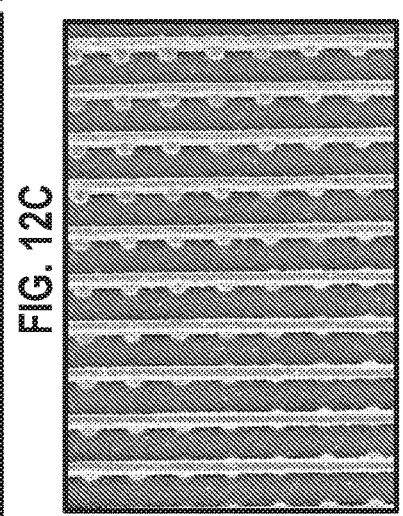
FIG. 12A  FIG. 12B  FIG. 12C  FIG. 12D  FIG. 12E  FIG. 12F  FIG. 12G

PATTERNING OF NANOSTRUCTURES USING IMPRINT LITHOGRAPHY

CROSS-REFERENCE TO RELATED APPLICATION

This application is a U.S. National Stage Filing under 35 U.S.C. 371 from International Application No. PCT/US2017/039294, filed on Jun. 26, 2016, and published as WO 2018/009363, which claims the benefit of priority to U.S. Provisional Patent Application Ser. No. 62/359,967 entitled "DIRECT PATTERNING OF OXIDE NANOSTRUCTURES USING IMPRINT LITHOGRAPHY AND NANOPARTICLE DISPERSION INKS," filed Jul. 8, 2016, the disclosures of which are incorporated herein in their entireties by reference.

STATEMENT OF GOVERNMENT SUPPORT

This invention was made with Government support under Nos. CMMI-1025020 and CMMI-1258336 awarded by National Science Foundation. The U.S. Government has certain rights in this invention.

BACKGROUND

Patterned metal oxide and semiconductor films are ubiquitous in functional device architectures. Typical fabrication pathways are subtractive by nature and contain multiple steps, including deposition of a planar film by chemical or physical deposition methods such sputtering or chemical vapor deposition, application of a photoresist, patterning of the resist using optical lithography, development of the resist, etching the metal oxide and stripping of the residual resist. The fabrication sequence is usually carried out in a clean room facility and employs batch processes, some of which operate at elevated temperatures and reduced pressures. Consequently, patterned inorganic film fabrication is often cost, equipment, materials and energy intensive and is not amendable to continuous as opposed to batch fabrication.

The development of additive or direct patterning techniques for metal oxide and semiconductor films, particularly using approaches that are scalable for continuous production and operate at ambient pressure and modest temperatures would be enabling for the low cost production of fully functional printed electronics or for devices that require large active areas. Among the most significant challenges are fabrication rate and integration density. Many printing approaches yield structures with minimum features sizes of tens or hundreds of microns, while acceptable performance thresholds often require features in the deep sub-micron range. For example, features below 250 nm are required for the manipulation of visible light while features below 1 micron are required to approach electronic device integration densities achieved by the semiconductor industry in the 1980s.

Advances towards direct writing and other approaches to directly patterned inorganic device layers have been realized over the past decade. Direct Ink Writing (DIW) introduced a serial writing approach to produce patterned structures via coagulation of polyelectrolyte, colloidal or sol-gel precursor inks printed via extrusion through micron-scale nozzles. For example amorphous metal oxide structures could be produced using sol-gel inks in arbitrary 1-D and 3-D structures with lateral dimensions on the order of 2 and 4 microns, respectively. For $TiO_2$ fabrication, calcination of the printed inks to yield anatase resulted in 80% volume shrinkage and minimum feature sizes on the order of 0.25 and 0.5 microns for the 1-D and 3-D structures. Micron-scale inorganic structures can also be produced by first creating a sacrificial organic template structure by DIW using polyelectrolyte inks followed by coating the structure using CVD or another deposition method and removing the template by calcination. Such an approach has been used for the fabrication of silicon woodpile structures, for example. While an effective additive approach, challenges for DIW include rate limitations due to serial writing and direct printing of deep sub-micron features without relying on volumetric shrinkage of precursor structures.

Nanoimprint (NIL) and soft lithography offer the potential for large area, rapid and scalable patterned film fabrication. Thermal imprint lithography (embossing) and UV-assisted NIL (light-induced polymerization of a liquid resin in contact with a master) have been scaled for roll-to-roll production and can produce patterned polymer film with critical dimensions as small as 50 nm at feet-per-minute rates. NIL in combination with thermal/UV induced polymerization of oligomers containing Si, Ti or Zr atoms in order to improve refractive index has been used to imprint optical waveguides and 2-D photonic structures. Recently, UV-NIL has been employed for the patterning of optical gratings nano-to-micro scale 2-D photonic patterns and 3-D photonic crystals using hybrid polymer/nanoparticle (NP) resists system of tunable refractive index and metal oxide NP loadings of up to 90 wt %.

Thermal or UV-NIL patterning of metal oxide films is typically pursued by imprinting sol-gel precursor containing solutions followed by calcination to drive formation of the metal oxide structure, remove organics and in some cases crystallize the nascent amorphous metal oxide. The transition from sol to amorphous gel phase in the soft mold features typically leads to a height reduction of the imprinted features of 40-60%. High temperature calcination to obtain a crystalline phase is accompanied by additional reductions in dimensions (60-80%), which causes further dimensional instability and cracking.

As an alternative to thermal or UV-assisted NIL, one variation of soft imprint lithography employs solvent-permeable stamps to remove solvent from a particulate ink system, leaving behind solids. Such an approach has been used to pattern lines of metal NPs, including gold that can be subsequently annealed to produce conductive features. However, elevated temperatures required post-imprinting to impart conductivity and to remove organic ligands bound to the gold NPs to impart stability to the ink leads to significant shrinkage and feature distortion. For example the removal of organics from a NP ink stabilized with 18 wt % ligand leads to 80% volumetric shrinkage based on component densities.

SUMMARY OF THE INVENTION

The present invention provides, in some embodiments, a method of manufacturing a textured surface comprising disposing an ink on a substrate, in which the ink comprises nanoparticles and a sol gel precursor, contacting the ink with a textured mold, in which the mold is permeable to a solvent present in the ink and is operative to absorb the solvent, transferring a texture from the textured mold to the ink, and annealing the substrate.

The present invention also provides, in some embodiments, an article comprising a substrate; a 1-dimensional, 2-dimensional or a 3-dimensional structure disposed on the substrate, in which the 1-dimensional, 2-dimensional or a 3-dimensional structure are manufactured by a method comprising disposing an ink on the substrate, in which the ink comprises nanoparticles and a sol gel precursor, contacting the ink with a textured mold, in which the mold is permeable to a solvent present in the ink and is operative to absorb the solvent, transferring a texture from the textured mold to the ink, and annealing the substrate.

Unexpectedly and advantageously, some embodiments of the inventive membranes have a variety of high aspect ratio crystalline inorganic oxide nanostructures can be directly fabricated by practicing solvent/thermal/UV-assisted soft nanoimprint lithography on inks containing metal oxide nanoparticles. Advantageously, the nanoparticle based soft imprinting techniques disclosed herein are capable of producing large area nanopatterns in a rapid fashion. Unexpectedly, low-shrinkage at elevated temperatures is observed in crystalline nanoparticle based nanopatterns (less than 8% linear shrinkage in imprinted feature height upon heat treatment at 500° C.) when the nanopatterns are imprinted according to embodiments of the methods described herein. In some embodiments, the methods described herein are a substantial improvement over sol-gel based methods, which suffer from significant shrinkage when the structures are first condensed to form the metal oxide network and then heated to obtain a crystalline morphology. Unexpectedly, in some embodiments, the porosity in the nanoparticle-based features is as good as or better than the porosity in nanostructures obtained by use of sol-gel based methods. Advantageously, in some embodiments the methods described herein can be used to fabricate residual-layer free nanopatterns, 3-D nanopatterns and high integration density 2-D nanopatterns by using a print-planarize-print approach.

Advantageously, in some embodiments, the methods described herein can be used for rapid and efficient preparation of crystalline metal oxide 3-D nanostructures and high integration density complex 2-D nanostructures through simple printing in an additive manner. Additionally, conventional subtractive processing steps typical or traditional clean room fabrication including lithography and etching steps are not required.

In some embodiments, the methods described herein advantageously enable the manufacture of high integration density printed nanostructures for a broad range of applications, including Li ion micro batteries (anodes and cathodes), optical applications including 3-D photonic crystals, high surface area electrodes for biosensors and memory devices.

BRIEF DESCRIPTION OF THE FIGURES

The drawings illustrate generally, by way of example, but not by way of limitation, various embodiments of the present invention.

FIG. 1A is a schematic of solvent-assisted soft nanoimprint lithography for patterning NP-based nanostructured films with an ink comprised of a NP (nanoparticle) dispersion in an organic solvent is applied onto a silicon wafer by spin coating, in accordance with various embodiments. FIG. 1B is a schematic of a patterned PDMS stamp placed on the ink; solvent permeates through the stamp creating a rigidified NP-based nanostructure as guided by the features in the stamp, in accordance with various embodiments. FIG. 1C is a schematic of a patterned NP-based film obtained upon removal of the stamp, in accordance with various embodiments.

FIG. 2A is a particle size distribution of 5 wt % ITO dispersion in IPA (before solvent exchange) and 5 wt % ITO dispersion in NMP (after solvent exchange), as obtained by dynamic light scattering, in accordance with various embodiments. FIG. 2B is a digital photograph of ITO dispersion in NMP. FIG. 2C is a TEM image of ITO NPs, in accordance with various embodiments.

FIG. 3A-3F depicts SEM images of ITO nanostructures—before and after calcination at 500° C. for 1 hour—imprinted using ITO NPs dispersed in NMP. FIGS. 3A and 3B are cross section views of ITO grating pattern (line width at the base of the line (LW), ~130 nm; line pitch (LP), ~450 nm; line height (LH), ~380 nm) imprinted with a 2.54×2.54 cm$^2$ composite-PDMS stamp made using a silicon master mold, in accordance with various embodiments. FIG. 3C is a line pattern after heating at 500° C. for 1 h (LW, ~130 nm; LP, ~450 nm; LH, ~365 nm). FIG. 3D is a top SEM image of ITO via features imprinted in square array pattern (hole radius (HR), ~125 nm; hole pitch (HP), ~340 nm; hole depth (HD), ~355 nm) imprinted from ITO NPs dispersed in NMP using a 10×10 mm$^2$ composite-PDMS stamp, in accordance with various embodiments. FIGS. 3E and 3F are top views of via features after heating at 500° C. for 1 h (HR, ~125 nm; HP, ~340 nm; HD, ~340 nm). Inset in FIG. 3F shows the cross section view of via features after heating at 500° C., in accordance with various embodiments. The angle of tilt in FIG. 3A-3C is less than 4° and in FIG. 3F is 8°. Imprinting for all samples was performed at room temperature and imprinting time of several minutes was observed before stamp was removed.

FIGS. 8A-8G are cross-section SEM images of patterned $TiO_2$ gratings imprinted with inks having different weight ratios of $TiO_2$ NPs and UV curable TPA sol. FIG. 8A-8C show As-imprinted gratings: FIG. 8A, 100 NP (LH, 385 nm), FIG. 8B, 80 NP/20 sol (LH, 380 nm), and FIG. 8C, 100 sol (LH, 275 nm) imprinted with a 2.54×2.54 $cm^2$ composite-PDMS stamp made using silicon master mold and cured under UV, in accordance with various embodiments. FIGS. 8D-8F are images of gratings upon calcination at 500° C. for 3 h: FIG. 8D, 100 NP (LH, 360 nm), FIG. 8E, 80 NP/20 sol (LH, 340 nm), FIG. 8F, 100 Sol (LH, 140 nm). FIG. 8G is a 100 NP grating pattern (LH, 320 nm) upon calcination at 750° C. for 3 h, in accordance with various embodiments.

FIG. 9A is a chart of the Refractive Index of 100 NP, 80 NP/20 sol and 100 sol films calcined at 500° C. for 3 h. FIG. 9B is a series of XRD patterns of 100 NP, 80 NP/20 sol and 100 sol films calcined at different temperatures for 3 h, in accordance with various embodiments.

FIGS. 12A-12G are photographs of $TiO_2$ 3-D nanostructures fabricated using print-planarize-print approach on a 2.54×2.54 $cm^2$ Si coupon: FIG. 12A is an image of a bilayer structure, in accordance with various embodiments. FIG. 12B is an image of a tetralayer after removal of organic planarizing layer by calcination, in accordance with various embodiments. FIG. 12C is an image of a bilayer heated to 850° C. for 1 h, in accordance with various embodiments. FIG. 12D is an image of a tetralayer heated at 1000° C. for 1 hour, in accordance with various embodiments. FIGS. 12E and 12F are images of bilayers featured with lines running over pillars, in accordance with various embodiments. FIG. 12G is an image of high integration density alternating pillar-line features, in accordance with various embodiments.

DETAILED DESCRIPTION OF THE INVENTION

Figure 4:
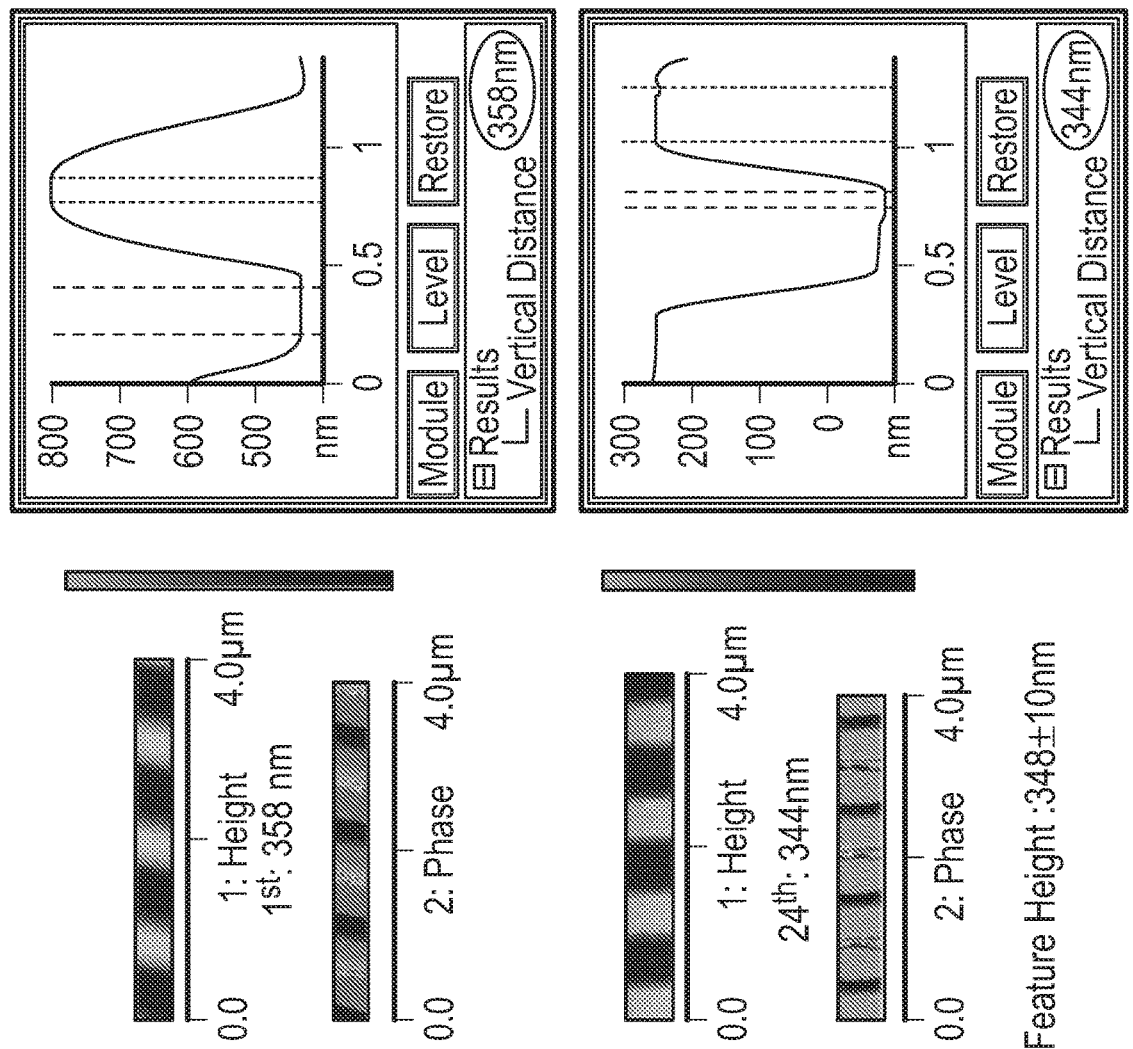
FIG. 4 is a digital photograph of 24 ITO grating line pattern samples of size 2.54×2.54 cm$^2$ imprinted at 120° C. with 15 seconds imprint time per sample (left), in accordance with various embodiments. LH measurement of first and last sample using AFM, with LH of all 24 samples between 348+/−10 nm (right). Color variation between the imprinted samples in the photograph arise due to different interference colors produced by the grating patterns at different viewing angles.

Reference will now be made in detail to certain embodiments of the disclosed subject matter, examples of which are illustrated in part in the accompanying drawings. While the disclosed subject matter will be described in conjunction with the enumerated claims, it will be understood that the exemplified subject matter is not intended to limit the claims to the disclosed subject matter.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" or "at least one of A or B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts can be carried out in any order without departing from the principles of the invention, except when a temporal or operational sequence is explicitly recited. Furthermore, specified acts can be carried out concurrently unless explicit claim language recites that they be carried out separately. For example, a claimed act of doing X and a claimed act of doing Y can be conducted simultaneously within a single operation, and the resulting process will fall within the literal scope of the claimed process.

The term "about" as used herein can allow for a degree of variability in a value or range, for example, within 10%, within 5%, or within 1% of a stated value or of a stated limit of a range, and includes the exact stated value or range.

The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%. The term "substantially free of" as used herein can mean having none or having a trivial amount of, such that the amount of material present does not affect the material properties of the composition including the material, such that the composition is about 0 wt % to about 5 wt % of the material, or about 0 wt % to about 1 wt %, or about 5 wt % or less, or less than, equal to, or greater than about 4.5 wt %, 4, 3.5, 3, 2.5, 2, 1.5, 1, 0.9, 0.8, 0.7, 0.6, 0.5, 0.4, 0.3, 0.2, 0.1, 0.01, or about 0.001 wt % or less.

The term "annealing" as used herein refers to exposing to radiation in any form, heating, or allowing to undergo a physical or chemical reaction or process that results in hardening or an increase in viscosity.

The term "radiation" as used herein refers to energetic particles travelling through a medium or space. Examples of radiation are visible light, infrared light, microwaves, radio waves, very low frequency waves, extremely low frequency waves, thermal radiation (heat), and black-body radiation.

The term "UV light" as used herein refers to ultraviolet light, which is electromagnetic radiation with a wavelength of about 10 nm to about 400 nm.

The term "partially" as used herein refers to a process that is not fully complete. The process can be about 10%, about 20%, about 30%, about 40%, about 50%, about 60%, about 70%, about 80%, about 90%, or about 95% complete, or any range or sub-range of these values.

The term "solvent" as used herein refers to a liquid that can dissolve a solid, liquid, or gas. Non-limiting examples of solvents are silicones, organic compounds, water, alcohols, ionic liquids, and supercritical fluids.

In some embodiments, disclosed herein is a method of manufacturing dimensionally stable 1-D, 2-D and 3-D high aspect ratio structures. In some embodiments, the method comprises using soft nanoimprint lithography by molding an ink that is disposed on a substrate, where the ink contains nanoparticle dispersions in a solvent or in sol-gel precursors for the metal oxide. In some embodiments, the mold is textured and is capable of absorbing solvent present in the ink leaving behind a textured ink that is then subjected to annealing to create stable 1-D or 2-D structures. In some embodiments, the process may be repeated on top of the 1-D or 2-D structures to create 3-D structures.

In some embodiments, the annealing comprises heating, microwave irradiation, visible light irradiation, infra-red irradiation, and ultraviolet irradiation.

In some embodiments, the nanoparticles may include nanotubes, nanodots, fullerenes, nanowires, and the like. In some embodiments, the sol gel precursors are primarily for the metal oxide used in the nanoparticles. However, the sol gel precursor can include polymers that are end-functionalized with reactive species that can react and covalently bond with the sol gel precursors. In some embodiments, the 1-D, 2-D or 3-D structures may be manufactured from metal oxides, metal nitrides, metal oxynitrides, metal carbides, metal borides, metal oxycarbides, metal silicides, or combinations thereof.

The ink can contain the nanoparticles in an amount of 50 to 90 wt %, or any range or sub-range in between, based on the total weight of the ink. In some embodiments, the ink contains nanoparticles in an amount of 55%, 60%, 65%, 70%, 75%, 80%, or 85%, based on the total weight of the ink, or any range between any two of these values. The sol gel precursors can be present in an amount of 10 to 50 wt %, or any range or sub-range in between, based on the total weight of the ink. In some embodiments, the sol gel precursors are present in an amount of 15%, 20%, 25%, 30%, 35%, 40%, or 45%, or any range or sub-range in between, based on the total weight of the ink.

In some embodiments, the NP ink composition can comprise a binder in place of, or in addition to, the sol gel precursor. Suitable binders include, without limitation, polyvinylpyrrolidone, poly(acrylic) acid, and poly(vinyl) alcohol.

In some embodiments, the mold can be manufactured from a polymer in its elastic state. In an embodiment, the mold is an elastomer that is permeable to a solvent used in the ink. Suitable elastomers can include polyurethanes, polysiloxanes, polybutadienes, polyisoprenes, polyvinylnitriles, and the like. In some embodiments, exemplary elastomers are crosslinked via covalent bonds. The elastomer can also contain physical crosslinks such as those obtained via hard blocks (in copolymers), crystals, and the like. In some embodiments, an exemplary elastomer is a polysiloxane. In some embodiments, the polysiloxane is a poly(dimethylsiloxane) (PDMS).

In some embodiments, dimensionally stable 1-D, 2-D and 3-D high aspect ratio crystalline metal oxide nanostructures can be fabricated using soft nanoimprint lithography with inks comprised of nanoparticle (NP) dispersions in solvent or in sol-gel precursors for the metal oxide. In some embodiments, crystalline $TiO_2$ and indium tin oxide (ITO) NP dispersions in solvent are imprinted using a solvent permeable patterned poly(dimethylsiloxane) stamp to yield robust crystalline nanostructures that are dimensionally stable to calcination (less than 8% linear shrinkage in imprinted feature heights upon heat treatment at 500° C.). In some embodiments, inks comprising 80% crystalline NPs dispersed in 20% sol-gel binder are patterned using thermal- or UV-assisted imprinting with a PDMS stamp. In some embodiments, the composition and physical properties of the dimensionally stable imprinted metal oxides ($TiO_2$ and ITO) can be altered by varying the composition of the ink. In some embodiments, rapid printing of high aspect ratio nanostructures and sub-100-nm features can be achieved. Residual layer free, direct imprinting of isolated features is achieved by using an ink with the appropriate surface energy to ensure dewetting at stamp-substrate interface. In some embodiments, the technique is extended to create 3-D mesh nanostructures by deploying a layer-by-layer imprint strategy. $TiO_2$ 3-D mesh nanostructures are robust and mechanically stable to calcination at temperatures of 1000° C., which results in an anatase to rutile transition. In some embodiments, the direct fabrication of high quality dimensionally stable metal oxide nanostructures can achieve solution based and roll-to-roll processing of robust and efficient inorganic electronic, optical, and energy generation and storage devices. In some embodiments, contacting of the nanoparticle ink with a textured mold is conducted at a pressure of 0.1 to 5 MPa. In some embodiments, contacting of the nanoparticle ink with a textured mold is conducted at a pressure of 0.1, 0.25, 0.5, 0.75, 1.0, 1.5, 2.0, 2.5, 3.0, 3.5, 4.0, 4.5, or 5 MPa, or any range or subrange between these values.

In some embodiments, the imprinted features lack an underlying connecting layer, such that the features are physically isolated from each other. Such isolated features can be imprinted using a suitable textured mold or stamp that is configured to not allow NP ink to connect the individual features. In some embodiments control of the wetting of the ink on the substrate and the mold is used to facilitate the creation of isolated features. Such control can be exerted by controlling surface energies of the substrate or mold or the surface tension of the ink. In some embodiments, the transfer of the texture from the mold to the ink is configured to produce features in the ink that are not connected together by an underlying layer.

In some embodiments, a solvent permeable patterned poly(dimethylsiloxane) (PDMS) stamp is used to imprint an ink containing crystalline NPs in an organic solvent. In some embodiments, the composition and physical properties of imprinted metal oxides can be altered by doping crystalline NP based inks with UV/thermally curable metal oxide sol-gel precursors. In some embodiments, curable sols in the ink imparts fluidity and enables imprinting at low solvent concentration in the ink. In some embodiments, the use of NPs dispersed in sols as inks advantageously reduces the requirement of solvent transport into the stamp during patterning, simplifying the process and providing advantages in speed and scalability. In some embodiments, the as-imprinted nanostructures are highly crystalline with low residual organics and therefore undergo little shrinkage (less than 5% in some cases) upon thermal annealing. Advantageously, the method according to some embodiments is scalable and can produce large area device quality nanostructures in a rapid fashion at a low cost. In some embodiments, nanopatterns of ITO (indium tin oxide), a transparent conductive oxide and $TiO_2$, a transparent high refractive index material, can be used in solar cell electrodes and photonic devices.

In some embodiments, imprinted metal oxide nanostructures can be made using inks that are comprised of stable suspensions of crystalline NPs in polar organic solvents, and mixtures of crystalline NPs with metal oxide sol-gel precursors. In some embodiments, a solvent permeable PDMS stamp replicated from a hard master mold is used for imprinting. In some embodiments, NP inks can be obtained by replacing isopropyl alcohol (IPA) or water in commercially available pH-stabilized NP dispersions with low vapor pressure polar organic solvents, or mixtures of polar organic solvents. In some embodiments, the polar organic solvent can be N-methyl-2-pyrrolidone (NMP) or a NMP-methanol solvent mixture. Dispersions of NPs functionalized with significant quantities of covalently bound organic ligands were avoided as removal of the ligands can lead to large volume contraction and feature deformation. According to one embodiment, a schematic of solvent-assisted soft nanoimprinting of NPs for patterned metal oxide films is shown in FIG. 1. In some embodiments, after spin-coating the inks, a PDMS stamp is placed on the film. Good air permeability of the PDMS stamp and capillary forces promote conformal contact without formation of air inclusions at the interface, resulting in uniform filling of the stamp features with the ink. The ink dries as the solvent permeates through PDMS, creating rigidified NP based nanostructures as guided by the stamp features. In some embodiments, nanostructures obtained after removal of stamp are stable as the strong electrostatic interaction between the NPs upon removal of solvent prevents collapse. In some embodiments, the thickness of spin coated films is influenced by ambient humidity with higher humidity leading to thinner films. Spin speed and ink composition can be adjusted in order to tune residual-film thickness beneath the imprinted structures.

In some embodiments, inks comprising ITO NPs dispersed in NMP can be obtained by replacing isopropyl alcohol (IPA) with NMP in commercially available ITO dispersions in IPA. The choice of solvent is driven by three factors, the solvent should have low vapor pressure to allow a broad time-window for spin-coating and imprinting, it should not promote excessive swelling of PDMS stamp, and it should have similar polarity to the solvent present in the initial dispersion in order to ensure dispersion stability after solvent exchange step. FIG. 2A shows the size distribution of the NPs and NP aggregates in suspensions before and after exchanging solvent, as obtained by dynamic light scattering (DLS). In some embodiments, the average aggregate sizes before and after exchanging solvent from IPA to NMP were 49 nm and 54 nm respectively, suggesting that there is negligible additional agglomeration of NPs after exchanging solvent. In some embodiments, the average aggregate sizes before and after exchanging solvent from IPA can be about 40 nm to about 50 nm. In some embodiments, the average aggregate sizes before and after exchanging solvent from NMP can be about 52 nm to about 60 nm. FIG. 2B shows an optical image of ITO NP suspension in NMP obtained after solvent exchange step, which is stable for over a year. FIG. 2C shows transmission electron microscopy (TEM) image of ITO NPs with majority of the particles below 30 nm in size. In some embodiments, the ITO NP average particle size (as determined by the largest dimension in the particle) is about 10 nm, 11 nm, 12 nm, 13 nm, 14 nm, 15 nm, 16 nm, 17 nm, 18 nm, 19 nm, 20 nm, 21 nm, 22 nm, 23, nm, 24 nm, 25 nm, 26 nm, 27 nm, 28 nm, or 29 nm, or any range or sub-range in between these sizes.

FIG. 3A-3F shows SEM images of ITO nanostructures imprinted using crystalline ITO NP-based ink and a patterned bilayer composite-PDMS stamp. In some embodiments, the composite-PDMS stamp comprises a thin layer of patterned h-PDMS backed by a thick layer of Sylgard-184 PDMS. The pattern in h-PDMS layer of the composite-PDMS stamp can be replicated using a silicon master mold. FIGS. 3A and 3B shows the cross-section SEM images at two different length scales of ITO grating structures imprinted with a square inch-sized composite-PDMS stamp made using the silicon master mold. Line-width at the base of the lines (LW), line pitch (LP) and line height (LH) of printed grating structure are ~130 nm, ~450 nm and ~380 nm respectively, whereas the LW, LP and LH of the silicon master from which patterned composite-PDMS stamp is made are ~210 nm, ~450 nm and ~480 nm respectively. In some embodiments, and without being bound by theory, the reduction in the printed features dimensions is due to the volumetric shrinkage accompanied by removal of solvent through PDMS during imprinting.

The imprinted features are uniform in size and shape throughout the pattern. Once the imprinting is achieved, these crystalline NP-based features maintain structural integrity upon heating at elevated temperatures, which is often required during calcination and annealing to improve physical properties, for example conductivity in the case of ITO. FIG. 3C shows cross-section view of the grating structure (LW, ~130 nm; P, ~450 nm; LH, ~365 nm) after heating at 500° C. for 1 h, providing a feature height shrinkage of ~4%. X-ray diffraction (XRD) patterns for planar ITO NP-based thin film before and after heat treatment at 500° C., indicate Bragg reflections corresponding to cubic $In_2O_3$ (space group $Ia\bar{3}$) crystal structure. In some embodiments, the average grain size before and after heat treatment as determined by the line broadening of primary (222) reflection using Scherrer equation was 14.6 nm and 16.2 nm respectively, suggesting that shrinkage upon heating is mostly due to the removal of residual organic material in the films. FIGS. 3D and 3E show via structures with hole radii (HR) ~125 nm, hole pitch (HP) ~340 nm and hole depth (HD) ~355 nm imprinted in a square array pattern.

The imprinted structure therefore has a minimum hole-wall thicknesses of ~90 nm, suggesting that sub-100-nm features can also be imprinted using this strategy. FIGS. 3E and 3F show top views at two different magnifications of via patterns after heating at 500° C. for 1 h. In some embodiments, the HR, HP, and HD of the 500° C. heated sample were ~125 nm, ~340 nm and ~340 nm respectively, suggesting a low linear-shrinkage of less than 5%. In some embodiments, the surface areas of these high aspect-ratio line and hole patterns are ~2.7 fold and ~4.3 fold that of their projected areas respectively. In some embodiments, the surface areas of these high aspect-ratio line patters are 1.5, 1.7, 1.9, 2.1, 2.3, 2.5, 2.7, 2.9, or 3.1 fold that of their projected areas. In some embodiments, the surface areas of these high aspect-ratio hole patterns are 3.1, 3.3, 3.5, 3.7, 4.1, 4.3, 4.5, or 4.7 fold that of their projected areas. Advantageously, such high surface area transparent conductive oxide nanopatterns are useful for many applications, including as solar cell electrodes for improved device efficiency. The residual ITO layer at the base of the patterns is desirable for such an application, and can be eliminated if required by control of the substrate surface energies and solvent wetting. In some embodiments, the annealing the annealing is conducted at temperatures of up to 100° C., 200° C., 300° C., 400° C., 500° C., 600° C., 700° C., 800° C., 900° C., or 1000° C., or any range or sub-range in between. In some embodiments, the annealing is conducted at temperatures of 100 to 500° C. for a period of 5 minutes to 2 hours. In some embodiments, the annealing is conducted at temperatures between 100° C. to 1000° C. for a period of 5, 10, 15, 20, 25, 30, 40, 50, 60, 70, 80, 90, 100, 110, or 120 minutes, or any range or subrange in between these values.

In some embodiments, the dynamics of pattern generation depend on the rate of solvent removal via diffusion into the PDMS stamp, which can result in prolonged imprint times at room temperature. The diffusion rate can be improved by imprinting at moderately high temperatures. In some embodiments, the method is fast and reproducible with respect to creating the patterned nanostructures. In some embodiments, 24 consecutive 2.54 cm×2.54 cm array patterns of ITO gratings were imprinted using a single PDMS stamp (replicated from a silicon master with LW, ~475 nm; LP, ~950 nm; LH, ~475 nm) at 120° C. The ink was spin coated on Si wafers for 2 minutes and the stamp was placed on the substrate. The samples were heated at 120° C. for 15 seconds and the stamp was removed to obtain the patterned nanostructure. FIG. 4 shows a digital photograph of the 24 samples; the line height for all samples as measured by atomic force microscopy (AFM) varied between 338-358 nm.

Advantageously, such short imprinting times can be important for high volume manufacturing of nanostructures.

Figure 5A:
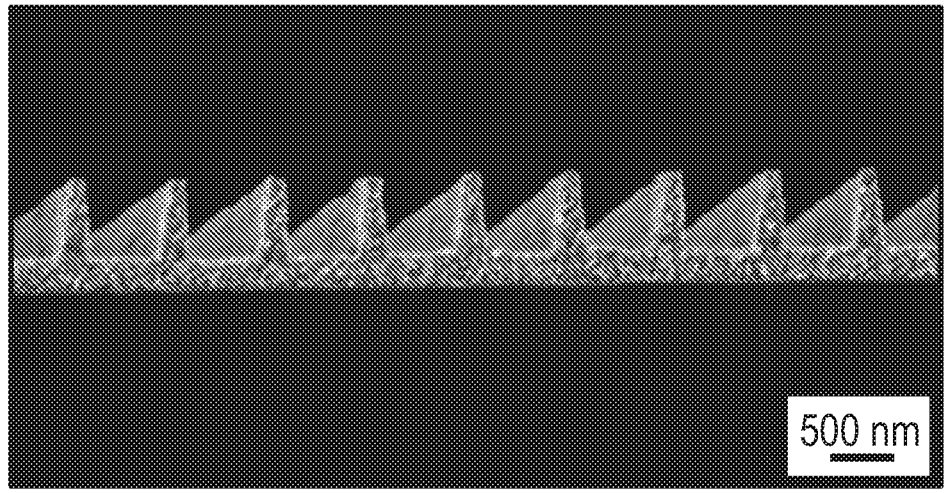
FIG. 5A is an image of ITO gratings imprinted in 30 seconds at 150° C. using an ink prepared by mixing ITO NP suspension and ITO sol in a proportion to provide 80 wt % ITO content from NPs suspension and 20 wt % from sol. The height of imprinted features is ~385 nm. Imprints were performed with a 2.54×2.54 cm$^2$ composite-PDMS stamp made using a silicon master mold, in accordance with various embodiments.
Figure 5B:
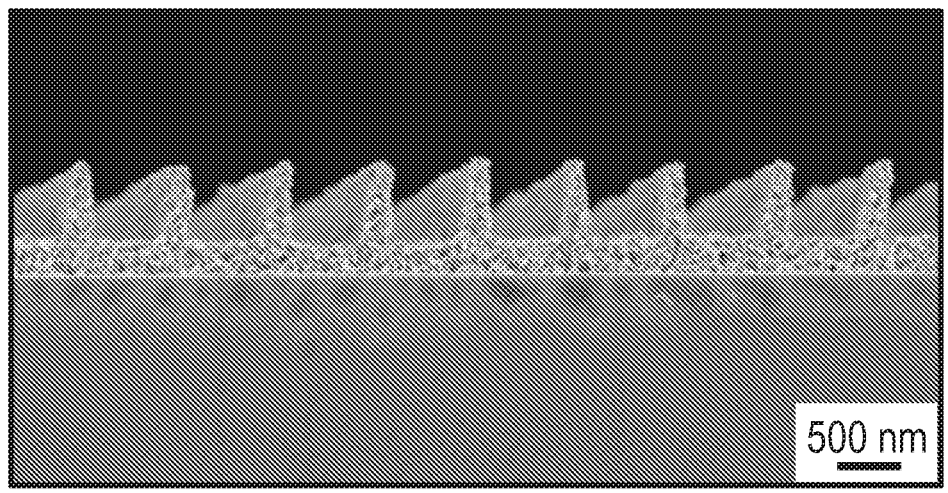
FIG. 5B is a grating pattern formed upon calcination at 500° C. for 1 h. The structure height is reduced to ~355 nm (approximately 8% shrinkage), in accordance with various embodiments.
Figure 6A:
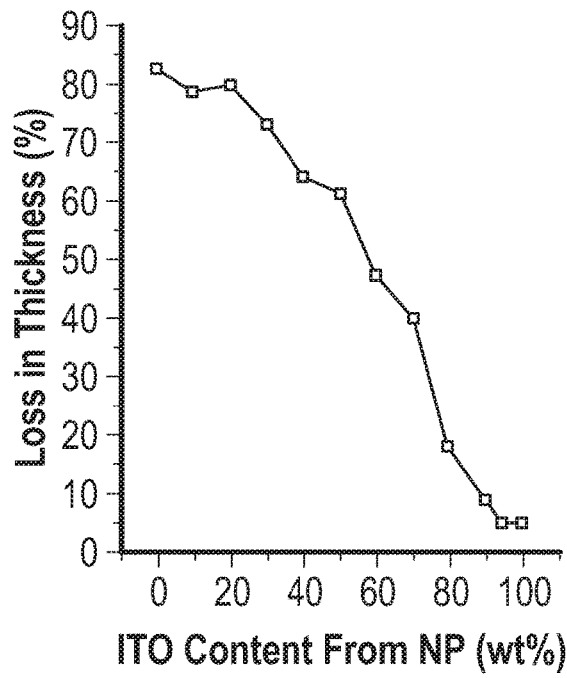
FIG. 6A is a chart of shrinkage in planar ITO thin films composed of different proportions of ITO NPs and ITO sol-gel precursor (based on solid content contributed by the two components upon calcination at 500° C.), in accordance with various embodiments. Initial thickness is measured after drying the spin coated planar film at room temperature for 72 h. Percentage loss in thickness is determined after calcination at 500° C. for 1 h.
Figure 6B:
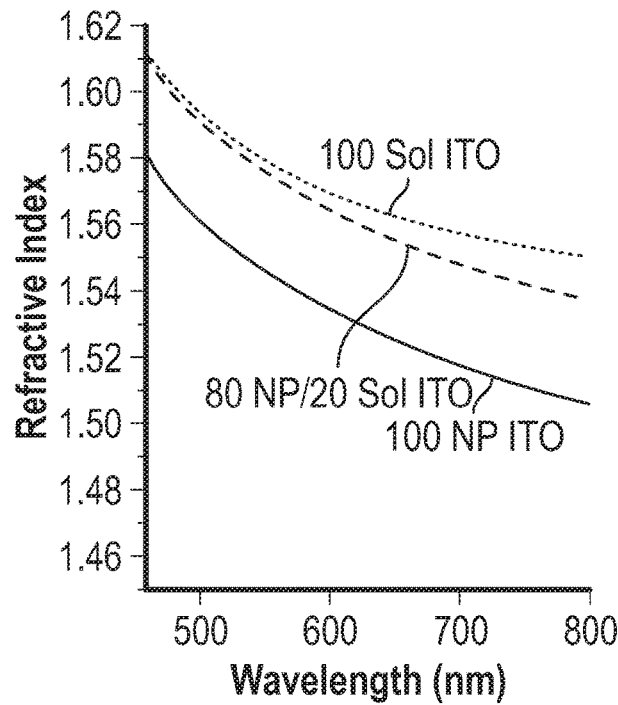
FIG. 6B is a chart of the refractive index of planar ITO thin films calcined at 500° C., in accordance with various embodiments.
Figure 6C:
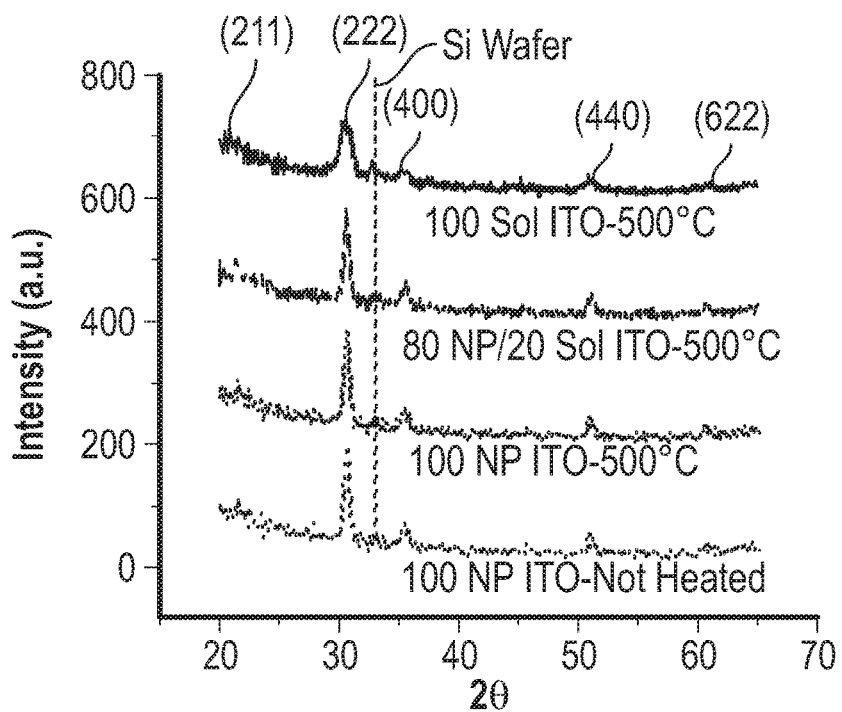
FIG. 6C is an XRD diffraction of planar ITO thin films with Bragg reflections corresponding to the cubic $In_2O_3$ crystal structure, in accordance with various embodiments.

In some embodiments, imprinting into the inks comprising high loading of crystalline ITO NPs in an ITO sol prepared using metal salt precursors also offer good dimensional stability and rapid processability. In some embodiments, the ink is prepared by mixing ITO NP suspensions in NMP and ITO sols (indium nitrate and tin (IV) acetate solution in NMP) in the desired proportion, i.e., to provide 'x' wt % ITO solid content from NP and '100-x' wt % from sol upon calcination at 500° C. The compositions are denoted by 'x NP/100-x sol ITO-ink', and the corresponding films are likewise denoted by 'x NP/100-x sol ITO'. FIG. 5 shows ITO gratings imprinted using 80 NP/20 sol ITO-ink. The composite-PDMS stamp used for imprinting can be made using silicon master molds. Advantageously, unlike NP films coated from solvent only, films coated from NP/sol dispersions can be imprinted even several hours after spin coating. To achieve rapid patterning, the composite-PDMS stamp was placed and the substrate was heated at 150° C. for 30 seconds to convert the imprinted viscous NP/sol dispersion into a rigidified structure. FIG. 5A shows gratings imprinted at 150° C. with ~385 nm tall lines. The pattern was then calcined at 500° C. for 1 h to remove residual organic material and convert the nascent amorphous binder into a crystalline phase, which resulted in line height reduction to 355 nm (~8% linear shrinkage). FIG. 6C shows XRD data for the calcined planar 100 sol ITO and 80 NP/20 sol ITO thin films indicating a crystalline morphology with average grain sizes 7.6 nm and 16.2 nm respectively. In some embodiments, inks with lower ITO sol content, for example 90 NP/10 sol ITO-ink, resulted in rigid films after spin coating for several minutes. Such inks therefore required solvent-assisted imprinting, akin to patterning complete NP-based films as described earlier.

In some embodiments, the relative proportions of crystalline NPs and sol in the ink determines dimensional stability upon calcination. In some embodiments, the nanoparticles comprise indium titanium oxide, titanium dioxide, aluminum oxide, silicon dioxide, or a combination thereof. In some embodiments, the nanoparticles can comprise a metal oxide, a metal nitride, a metal carbide, a metal oxynitride, a metal oxycarbide, a metal boride, a metal silicide, or a combination thereof. FIG. 6A shows reductions in film thickness measured using a mechanical profilometer of room temperature dried planar films upon calcination at 500° C. for 1 h. In some embodiments, films with greater than 80 wt % ITO content from NPs yielded thickness reductions of less than 20%, less than 18%, less than 16%, less than 14%, less than 12%, or less than 10%. In some embodiments, films fabricated using NPs and sol also showed lower sheet resistance compared to the films fabricated using only NPs. To measure sheet resistance, planar films were calcined for 1 h at 500° C. in air and annealed for 3 hours (h) at 300° C. in a stream of nitrogen to increase the concentration of oxygen vacancies. In some embodiments, the sheet resistances of 200 nm thick 80 NP/20 sol ITO films was 400-450Ω/□ (ohms/square). The sheet resistance of a 95 NP/5 sol ITO, 100 NP ITO and 100 sol ITO films with similar thicknesses (180-230 nm) were 2,000Ω/□ (ohms/square) and 9,000Ω/□ and 200-250Ω/□ respectively. Advantageously, the sheet resistances of the inventive films, in some embodiments, are superior or comparable to that reported by other researchers using solution processable NP and sol-gel based techniques.

Advantageously, in some embodiments, the large improvement in conductivity by adding sol to provide just 20 wt % ITO content from sol can be attributed to reduced porosity of the films, improved interfacial contact, and superior quality of ITO from sols compared to the ITO NPs. In some embodiments, the porosity in NP-based films arises in part from the interstitial voids between assembled NPs upon removal of the solvent, which can strongly vary with the size distribution of the NPs in the film. To compare porosity in the thin films, we measured refractive index (RI) using spectroscopic ellipsometry. RI fitting was performed by minimizing mean-square error (MSE) using a general oscillator layer model for ITO. FIG. 6B shows RI measured between 450-800 nm for 500° C. calcined 100 NP ITO, 80 NP/20 sol ITO and 100 sol ITO thin films on silicon substrates. The thicknesses of the films, RIs at 633 nm and mean square error (MSE) values are shown in Table 1. The small MSE values (less than 10) signifies good fitting of RI data. Taking the RI of dense ITO as 1.858 at 633 nm, porosities as calculated using the Lorentz-Lorenz effective medium approximation model are approximately 31.5% for 100 NP ITO, 28.3% for 80/20 ITO and 27.6% for 100 sol ITO films. In some embodiments, the porosities as calculated using the Lorentz-Lorenz effective medium approximation model are about 29.0% to about 35% for 100 NP ITO films. In some embodiments, the porosities as calculated using the Lorentz-Lorenz effective medium approximation model are about 26.0% to about 30% for 80/20 ITO films. In some embodiments, the porosities as calculated using the Lorentz-Lorenz effective medium approximation model are about 25.0% to about 30% for 100 sol ITO films.

In some embodiments, planar ITO films made by NP-based ink and NP/sol-based inks showed excellent optical transparency of more than 90% in the visible range, which suggests that there is no precipitation of large aggregates during film formation by the methods described herein. Table 1 shows fitted thickness, MSE and RI of planar ITO films on silicon substrate calcined at 500° C. for 1 h.

TABLE 1

|  | Thickness (nm) | MSE | RI at 633 nm |
|---|---|---|---|
| 100 NP ITO | 114 | 9.7 | 1.528 |
| 80 NP/20 sol ITO | 166 | 11 | 1.558 |
| 100 sol ITO | 74 | 12 | 1.564 |

Figure 7A:
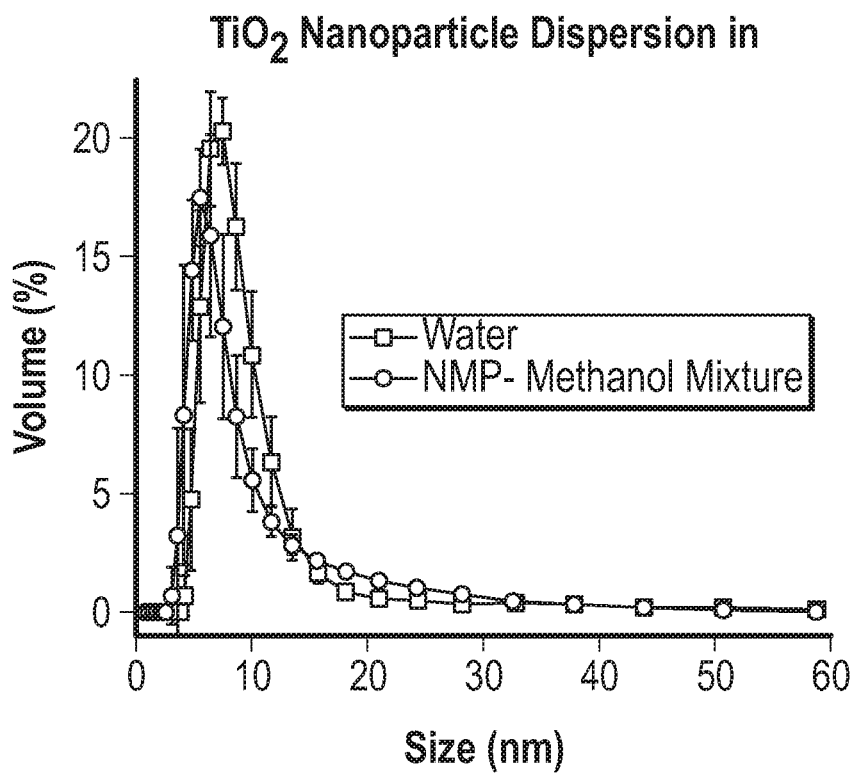
FIG. 7A is a chart of particle size distribution of 5 wt % $TiO_2$ dispersions in water (before solvent exchange) and in NMP-methanol mixture (after solvent exchange), as obtained by dynamic light scattering, in accordance with various embodiments.
Figure 7B:
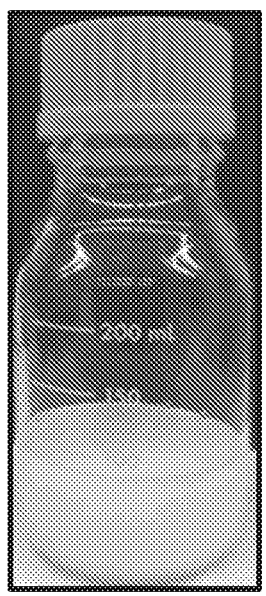
FIG. 7B is a digital photograph of $TiO_2$ dispersion in NMP-methanol mixture, in accordance with various embodiments.
Figure 7C:
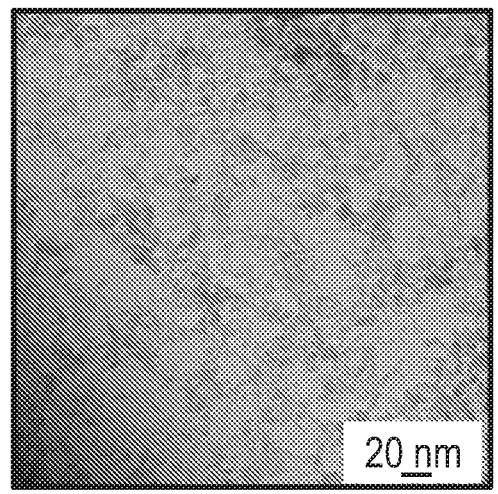
FIG. 7C is a TEM image of $TiO_2$ NPs, in accordance with various embodiments.

In some embodiments, solvent assisted NP-based imprinting can be used on other metal oxides, such as by imprinting of $TiO_2$ nanostructures. In some embodiments, $TiO_2$ NP dispersions for inks were obtained by replacing majority of the water in commercially available acid-stabilized aqueous $TiO_2$ (anatase) NP dispersions with a NMP-methanol solvent mixture. The particle size distribution in suspensions, as shown in FIG. 7A, of $TiO_2$ aggregates before (8.7 nm) and after (7.9 nm) solvent change from water to NMP-methanol mixture remained almost same. FIG. 7B shows an optical image of NP suspension in NMP-methanol mixture, which is stable for over a year with negligible precipitation. FIG. 7C shows TEM image of drop-casted $TiO_2$ NPs with the majority of particles below 8 nm. In some embodiments, at least 50%, 60%, or 70% of the $TiO_2$ NPs have a particle size as measured by the largest dimension in the particle of less than 8 nm.

Titania nanostructures were imprinted with inks comprised of different proportions of $TiO_2$ NP dispersions (in NMP-methanol mixtures) and a UV-curable $TiO_2$ sol, titanium diisopropoxide bis(acetylacetonate) (TPA), in IPA. TPA is one of the most common $TiO_2$ precursors as acetylacetonate (acac) chelates Ti and forms a stable metal complex. Acac, or more generally β-diketonate ligands, have an optical absorption band in the UV range from the π-π* transition. This photoexcitation of acac ligands gives rise to the dissociation of the chelate bonds of the metal complex increasing the reactivity of the metal precursor to form an amorphous $TiO_2$ network.

Figure 9A:
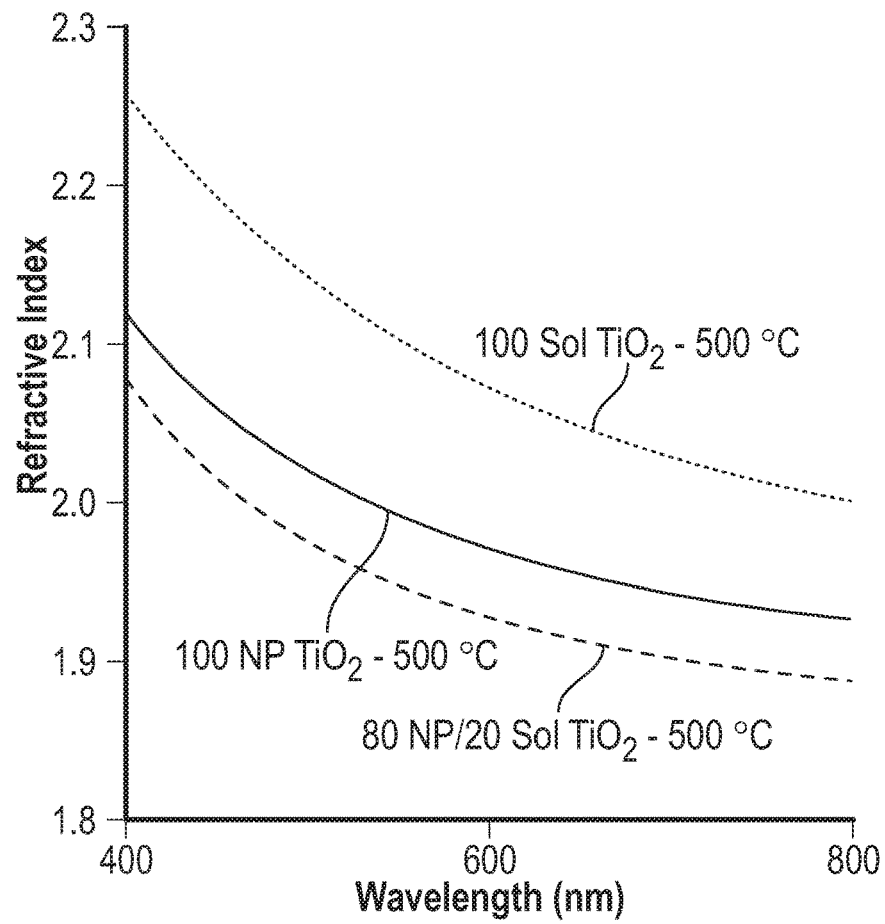
FIGS. 9A-9B show the characterization of planar $TiO_2$ thin films made with inks having different weight ratios of $TiO_2$ NPs and UV curable TPA sol.
Figure 9B:
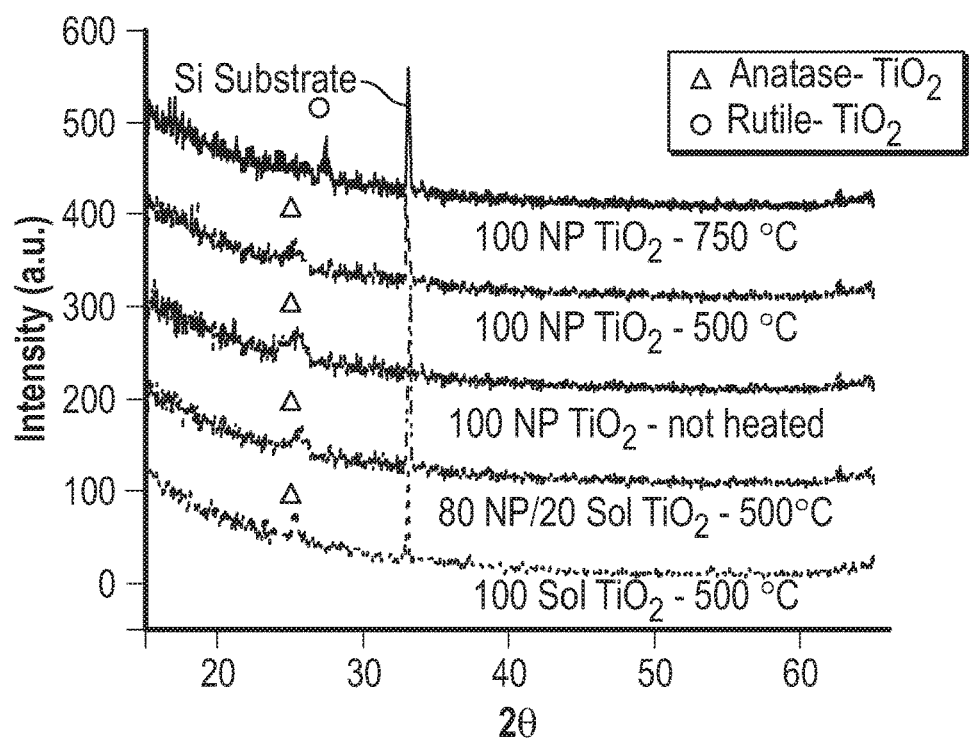

In some embodiments, imprinting was performed with a composite-PDMS stamp made using master mold. Samples were subjected to 10 km$^{-2}$ energy dose of long wavelength UV light after placing the stamp for imprinting in order to cure TPA sol. FIG. 8 shows cross sectional SEM of imprinted features composed of 100% $TiO_2$ NP (100 NP $TiO_2$), 80/20 (by weight) $TiO_2$ NP/TPA (80 NP/20 sol $TiO_2$) and 100% TPA (100 sol $TiO_2$) with feature height of 385 nm, 380 nm and 270 nm respectively, which upon calcination at 500° C. for 3 h reduce to 360 nm (~6% shrinkage), 340 nm (~11% shrinkage) and 140 nm (~48% shrinkage) respectively. FIG. 9B shows XRD of planar films before and after calcined at 500° C. for 3 h having anatase-$TiO_2$ reflection with mean crystallite size growing form 3.8 nm to 13.5 nm. The dimensional instability associated with enormous shrinkage observed upon calcination to obtain a crystalline phase in conventionally used sol-gel based soft NIL technique leads to distorted features (FIG. 8), in contrast to this, surprisingly low shrinkage upon calcination in features majorly comprising crystalline NPs imprinted using the inventive solvent-assisted soft NIL techniques described herein, rendered dimensionally stable nanostructures (FIGS. 8D and 8E). FIG. 8G shows 100 NP $TiO_2$ sample upon heating at 750° C. for 3 h, which resulted in line height reduction to ~320 nm (~17% shrinkage). XRD on 750° C. treated 100 NP $TiO_2$ film confirmed a transition from anatase- to rutile-$TiO_2$ phase and grain growth to 29.8 nm (FIG. 9B). In some embodiments, these structures remain mechanically stable despite significant crystal phase transition and grain coarsening. Planar films of 100 NP $TiO_2$ and 80 NP/20 sol $TiO_2$ showed transmittance greater than 90% in the visible regime, suggesting that NPs do not precipitate to form large agglomerates upon evaporation of the solvent during film formation.

$TiO_2$ due to its high RI and transparency can be useful for applications in photonic devices to manipulate visible light. FIG. 9A shows measured RI of anatase-$TiO_2$ planar films calcined for 3 hours at 500° C. The Cauchy model was used to fit the RI data, which is suitable for $TiO_2$ because of its transparency and low absorbance in the visible spectrum. The RIs of films containing NPs are lower than films made using only TPA sol. The thicknesses of the films, MSE values, RIs at 633 nm are shown in Table 2. Taking the RI of dense $TiO_2$ as 2.49 at 633 nm, porosities as calculated using Lorentz-Lorenz effective medium approximation model are 23.3% in 100 NP $TiO_2$ film, 25.6% in 80 NP/20 sol $TiO_2$ film and 18.5% for 100 sol $TiO_2$ film. In some embodiments, the porosities as calculated using Lorentz-Lorenz effective medium approximation model can be from about 20.0% to about 25.0% in 100 NP $TiO_2$ films. In some embodiments, the porosities as calculated using Lorentz-Lorenz effective medium approximation model can be from about 23.0% to about 28.0% in 80 NP/20 sol $TiO_2$ films. In some embodiments, the porosities as calculated using Lorentz-Lorenz effective medium approximation model can be from about 14.0% to about 20.0% in 100 sol $TiO_2$ films. Unlike in case of ITO, the RI of $TiO_2$ NP films did not improve by addition of the sol. Without being bound by theory, this could be due to the alteration in surface charge on $TiO_2$ NPs in the presence of TPA sol, leading to changes in coagulation dynamics during drying of the film.

Table 2 shows fitted thickness, MSE and RI of planar $TiO_2$ films on silicon substrate calcined at 500° C. for 3 h (hours).

TABLE 2

|  | Thickness (nm) | MSE | RI at 633 nm |
| --- | --- | --- | --- |
| 100 NP $TiO_2$ | 86 | 7 | 1.960 |
| 80 NP/20 sol $TiO_2$ | 103 | 17 | 1.917 |
| 100 sol $TiO_2$ | 70 | 9 | 2.056 |

Many applications require free-standing features without a residual layer. By taking the advantage of low surface energy of the stamp, ink solutions with low viscosity and appropriate advancing and receding contact angles on the stamp material can fill the recesses without leaving any residue on the surface. Such discontinuous wetting approach has been used to fill various elastomeric stamps with metal oxide sols, followed by imprinting on the substrate to achieve a residual-layer free pattern. The rate of filling of the ink, and the swelling of the stamp encountered due to an additional thick layer of solvent applied between stamp and substrate in order to pull out depressed solidified-ink from stamp-recesses on to the substrate can limit the imprinting speed in this method.

In addition to discontinuous wetting of the stamp, residual-layer free direct imprinting can be facilitated by application of modest pressure to squeeze-out low viscosity inks from between stamp/substrate interface during the imprinting process. Imprinting of gold features with minimal residual layers has been optimized using a low viscosity and low surface tension gold NP suspension in α-terpineol at a 5 pounds per square inch (psi) imprint pressure. This technique has also recently been optimized to imprint residual-free patterns of small organic molecules, which are then polymerized by thermal initiation.

Figure 11:
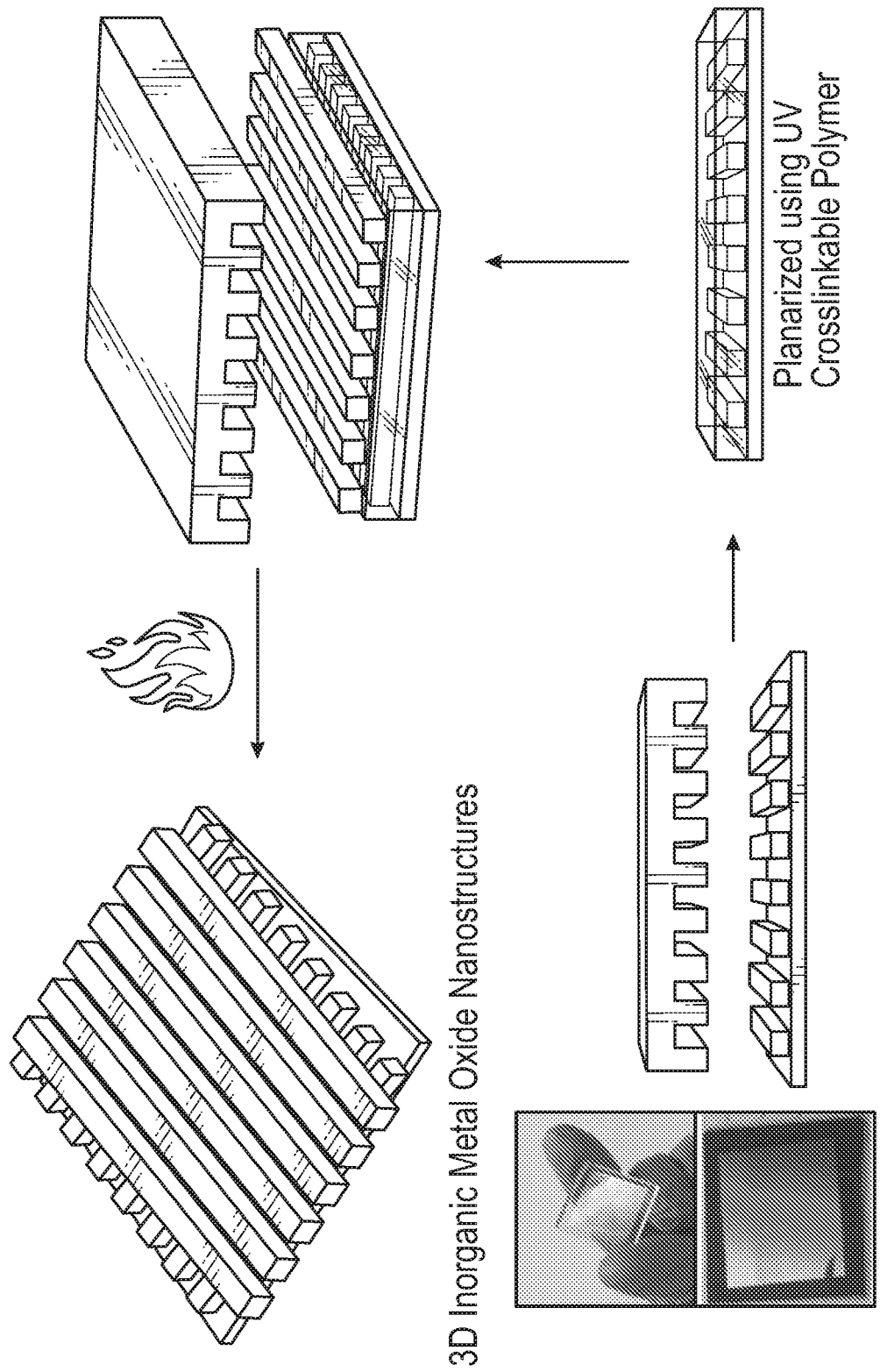
FIG. 11 is a schematic drawing of the fabrication of a 3-D metal oxide nanostructure by a print-planarize-print approach followed by calcination to remove organic planarizing layer, in accordance with various embodiments.

In some embodiments, in one method of manufacturing a 3-D structure, after the first texture comprising 1-D or 2-D structures is disposed on the substrate and subjected to annealing, a planarizing layer comprising a polymer is disposed on the first texture. The planarizing layer acts as a substrate for the second texture comprising 1-D or 2-D structures. After disposing a planarizing layer on the first texture, a second layer of ink is disposed on the planarizing layer. The mold once again contacts the ink to produce a second texture. During the second annealing step conducted after the mold contacts the second layer of ink, the polymer planarization layer is degraded forming a second texture on the first texture. By repeating this process a plurality of layers of texture can be disposed one atop another. This method can be used to form 3-D structures. FIG. 11 depicts one embodiment of this method.

In some embodiments, the technique can be extended to create 3-D nanostructures and high integration density 2-D nanostructures by deploying a simple layer-by-layer imprint strategy. In some embodiments, an inorganic patterned layer is imprinted, followed by planarization of topography with an organic crosslinkable polymer. Another inorganic patterned layer is imprinted on top of planarized layer, and the imprint-planarize-imprint sequence can be repeated for the desired number of times.

In some embodiments, after the desired number of imprint-planarize-imprint sequences, the sample is heat treated to burn out organics and anneal inorganic pattern, creating a complex inorganic 3-D nanostructure or high integration density 2-D nanostructure, depending upon inorganic pattern geometry and alignment of the pattern layers. In some embodiments, multilayer 3-D mesh structures, complex 3-D structures with lines running on top of pillars and high integration density 2-D nanostructure with lines running between pillars are fabricated as an illustration using this technique.

In some embodiments, $TiO_2$ 3-D mesh nanostructures fabricated by the methods described herein are robust and mechanically stable to calcination at temperatures of 1000° C., which results in an anatase to rutile transition. A tetralayer of $TiO_2$ mesh structure over 1"×1" area was fabricated within 15 minutes in total. Residual layer free imprinting is also developed by pre-wetting the substrate with a thin layer of polar solvent before spin coating ink so as to promote dewetting of ink at stamp-substrate interface. The technique is also mimicked by performing spin coating in a high humidity environment (70-100% relative humidity) which leads to more adsorption of water on substrate to promote dewetting of spin coated ink upon placing the stamp for imprinting. In some embodiments, combining imprint-planarize-imprint technique with residual layer free technique can produce 3-D structures with no residual layer bridging nanopatterns in each imprinted inorganic nanopattern layer.

Advantageously, the direct fabrication of high quality dimensionally stable metal oxide nanostructures enables solution based and roll-to-roll processing of robust device structures for electronics, sensors, optics, energy generation and storage and other applications. In some embodiments, the methods described herein provide a simple and robust means for creating 3-D structures and 2-D structures with increased integration density, and residual layer free inorganic nanopatterns by dewetting promoted by a thin solvent layer over substrate.

Figure 13:
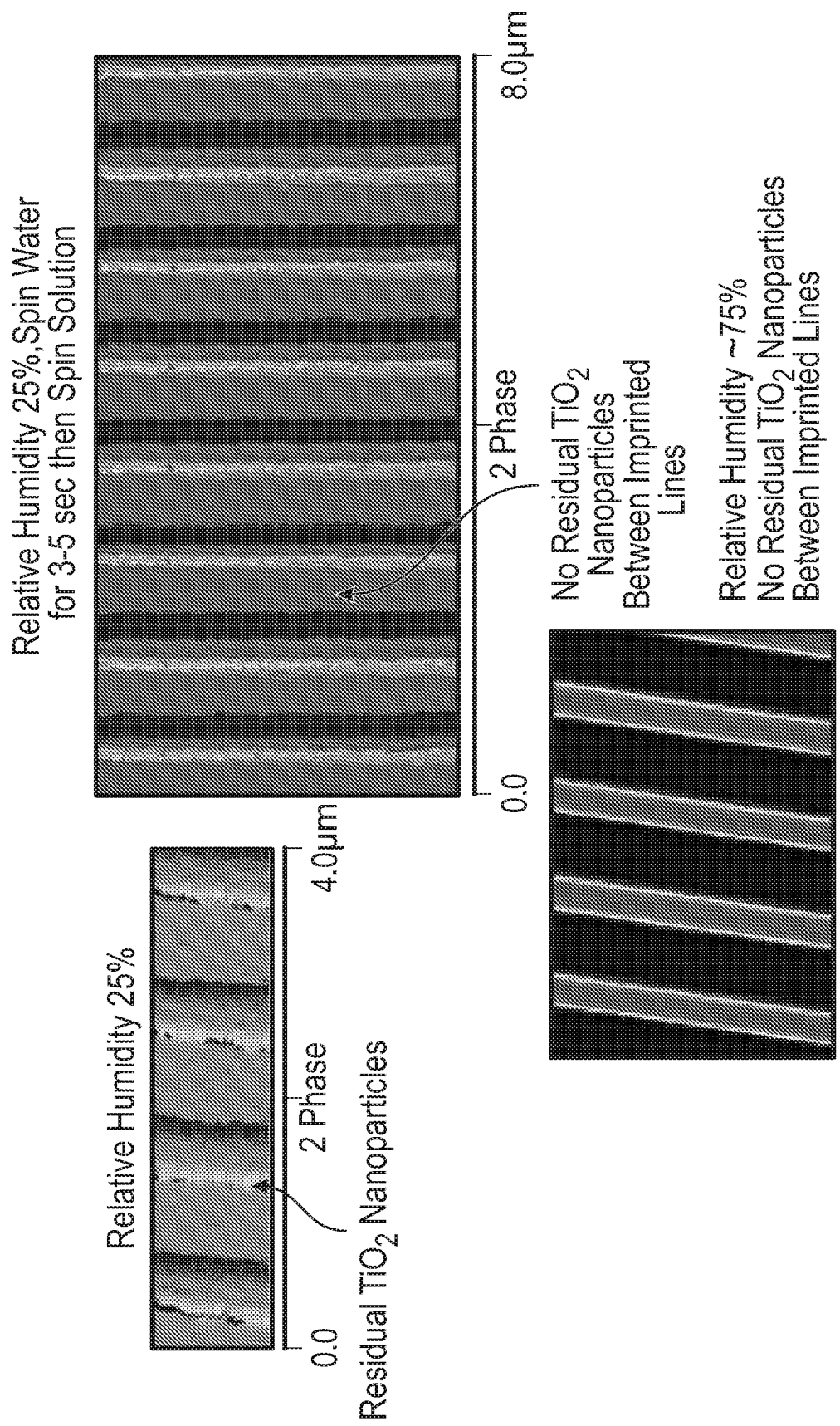
FIG. 13 is an illustration of the effect of relative humidity on texture quality, in accordance with various embodiments.

FIG. 13 shows the effect of relative humidity on the surface of the 1-D texture. When the nanostructures are created in an atmosphere having 25% relative humidity, extraneous titania particles are left on the surface of the texture. As relative humidity is increased to 75%, a smooth surface is produced.

Figure 10A:
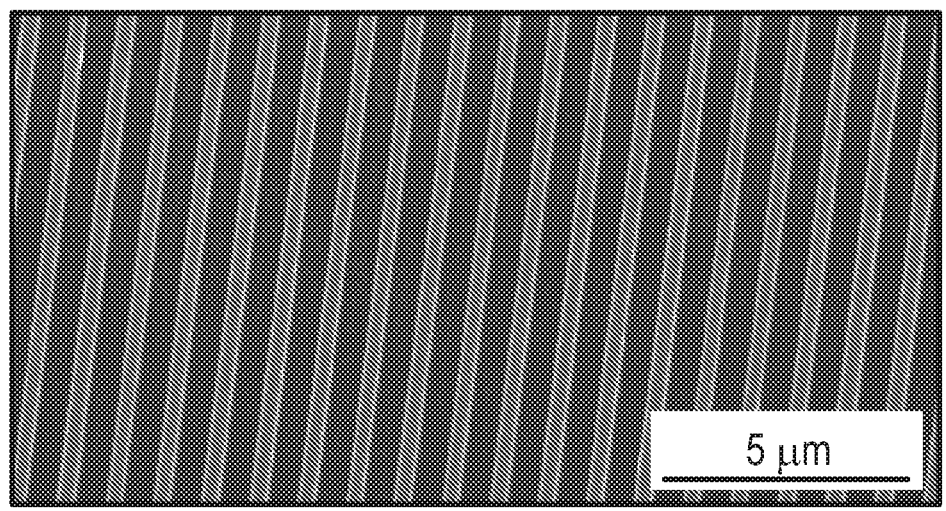
FIG. 10A is a top view of a residual layer-free $TiO_2$ grating pattern imprinted over 2.54×2.54 $cm^2$ area, in accordance with various embodiments.
Figure 10B:
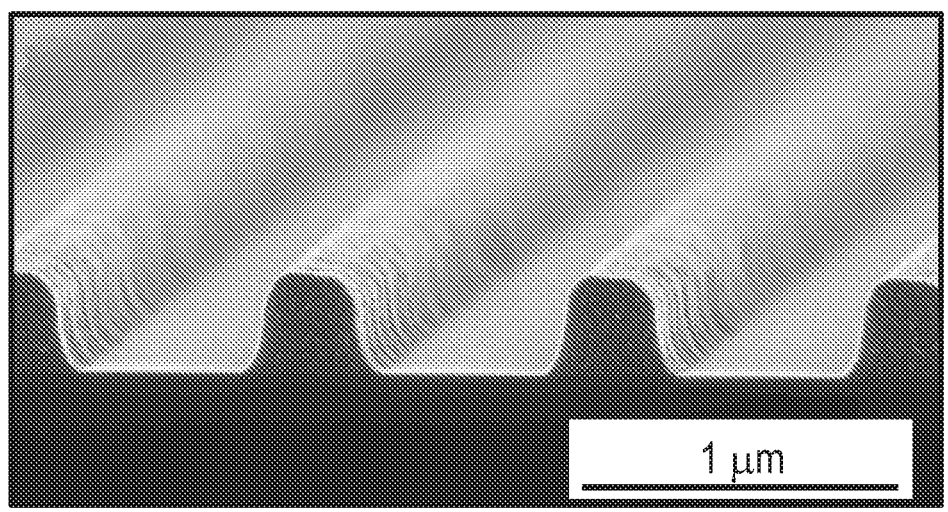
FIG. 10B is a tilted view of a residual layer-free $TiO_2$ grating pattern imprinted over 2.54×2.54 $cm^2$ area, in accordance with various embodiments.

In some embodiments, the method described herein can be used to produce residual-layer free imprinting of titania lines. In some embodiments, the ink is comprised of a ~3 wt % $TiO_2$ NP dispersion in propanediol-methanol solvent mixture, obtained by diluting 20 wt % $TiO_2$ NP stock dispersion in propanediol by methanol. The ink was spin-coated (at 3,000 RPM) onto a silicon wafer in a 70-80% relative humidity environment for about 2 minutes after which a PDMS stamp (LW, ~475 nm; LP, ~950 nm; LH, ~480 nm) was placed and light pressure applied. The substrate was then heated to 120° C. for 15 seconds and the stamp was removed to obtain residual-layer free line pattern (FIG. 10) with ~300 nm line height. In this case, high relative humidity was found to be important to obtain high quality residual-layer free imprints. High humidity can lead to thinner NP-based films suggesting that the interaction of ink with substrate is weaker at higher humidity, which will promote dewetting of the ink at the stamp/substrate interface during the imprinting process.

In some embodiments, continuous 3-D nanostructures composed of high loadings of ZnO NPs in UV-curable resins were fabricated using soft UV-NIL to pattern grating layers on pre-patterned sacrificial poly(vinyl alcohol) (PVA) substrate followed by transfer stacking and dissolving of the PVA substrate in water. Advantageously, such high RI photonic crystal patterns on LED showed enhanced light extraction from LED. In some embodiments, 3-D photonic crystals of high RI $TiO_2$ NPs/polymer composites were fabricated using soft UV-NIL to pattern gratings on a sacrificial planar PVA substrate, followed by dissolving the substrate and stacking the patterned grating layers to form the 3-D photonic crystals.

Advantageously, the ability to print NP-based features with minimal residual layers enables the fabrication of completely inorganic continuous 3-D nanostructures and high integration density 2-D nanostrucutres using a low feature density stamp by simple applying print-planarize-print approach (FIG. 11). In some embodiments, the first grating layer on a silicon wafer is imprinted using ~3 wt % $TiO_2$ NPs dispersion in propanediol-methanol solvent mixture as ink and a PDMS stamp (LW, ~475 nm; LP, ~950 nm; LH, ~480 nm) in 60-100% relative humidity environment. Imprinting time is 10 seconds at 120° C. The height of the imprinted line can be tuned between 250-300 nm by simply varying spin speed (2,000-3,000 RPM) or the concentration of the ink. In the second step the structure is planarized with a UV-crosslinkable low viscosity organic thiolene-acrylate prepolymer (NOA60, Norland Products Inc.) by spin-coating from a 20 wt % NOA 60 solution in propylene glycol monomethyl ether acetate (PGMEA) solvent followed 10 wt % NOA60 solution in PGMEA, with UV curing after each spin coating step. A low power oxygen plasma treatment before coating each planarization layer is found to improve of the quality of planarization layer. The low viscosity of NOA60 allows effective planarization (grating height reduce to 2-5 nm as measured by AFM) while leaving a thin residual layer (100-150 nm) atop of the first grating structure. The imprinting and planarization process is then simply repeated for the desired number of layers. Finally the organic planarization layer is removed by calcination.

In some embodiments, after the imprinting and planarization process is repeated for the desired number of layers, the sample is heat treated to burn out organics and anneal inorganic pattern, creating a complex inorganic 3-D nanostructure or high integration density 2-D nanostructure— depending upon inorganic pattern geometry and alignment of the pattern layers. FIGS. 12A and 12B show a bilayer and a tetralayer with ~240 nm grating-width at the top of the grating line following calcination to remove the planarization layer. FIG. 12C shows the bilayer after annealing at 850° C. for 1 h with grating width reduced to ~200 nm. Surprisingly, the structure remains stable despite conversion of TiO$_2$ from anatase to rutile and significant coarsening of the NP crystallites, as indicated by sharp primary rutile-peak in XRD. FIG. 12D shows the tetralayer after calcination at 1000° C. for 1 h with XRD suggesting highly crystalline rutile morphology with sharp higher order peaks. A slight sagging of the structure can be observed due to softening of TiO$_2$ at such high temperature. Bilayer featured with lines running over pillars (FIG. 12 E, 12F) and high integration density alternating pillar-line features were also fabricated as an embodiment of the methods described herein. High integration density alternating pillar-line features are fabricated by imprinting pillars in the first layer and lines in the 2$^{nd}$ layer by using corresponding low feature density stamps.

Continuous 3-D inorganic nanostructures using direct imprinting methods to stack residual-free patterned layers have been demonstrated in the past by transfer stacking patterned precursor layer on to a pre-patterned substrate and by transfer imprinting ink filled in a soft mold recesses on to a pre-patterned substrate. The drawback of the transfer stacking method is that it used the conventional thermal NIL technique for patterning, which involved a hard master mold to imprint into palladium organic ink at high processing pressure (50 bar). The excessive pressure used during imprinting and transferring caused cracking of stacked grating lines in some cases. The imprinted line pattern also suffered a massive line height reduction of 62% upon calcination due to the high organic content of the ink. Moreover, instead of appearing as a 3-D structure, the bilayer structure resembled a 2-D structure because of collapse of the soft metal organic ink pattern during heat treatment step. Bilayers generated by directly transfer imprinting silver NP ink filled in soft mold recesses on to a pre-patterned substrate also suffered from structural instability were the top layer completely bended and touched the substrate, probably due to sagging of the soft mold features during the imprinting step. Advantageously, in some embodiments, multilayer structures made according to methods described herein do not collapse upon heating up to 850° C. (FIGS. 12A-12C) because of the rigidity and robustness of as-imprinted grating layers. In some embodiments, multilayer structures made according to methods described herein do not collapse upon heating up to 400° C., 450° C., 500° C., 550° C., 600° C., 650° C., 700° C., 750° C., 800° C., 850° C., or any range or sub-range in between these values.

The invention is exemplified by the following non-limiting examples.

EXAMPLES

Various embodiments of the present invention can be better understood by reference to the following Examples which are offered by way of illustration. The present invention is not limited to the Examples given herein.

Fabrication of PDMS Stamps.

Patterned PDMS stamps were made by casting PDMS against silicon master molds. The silicon masters were cleaned in concentrated sulfuric acid and followed by treating for 15 minutes in an oxygen plasma cleaner. The silicon masters were then placed in a degassed glass jar at 80° C., to which 1 vol % of heptadecafluoro-1,1,2,2-tetrahydrodecyl)dimethylchlorosilane (Gelest Corp.) is introduced for a 12 h period. In this process a self-assembled monolayer of a long chain fluorinated alkane is created on silicon master molds which reduces their surface energy and facilitates easy removal of cured PDMS stamps casted against them in the next step.

Sylgard 184 silicone elastomer kits (Ellsworth Adhesive) were used to make PDMS stamps from the silicon masters with low aspect-ratio line patterns (LW, ~425 nm; LP, ~950 nm; LH, ~480 nm). A 10:1 (by weight) ratio of base to curing agent was thoroughly mixed and a ~3 mm thick layer was poured on the silicon master molds. Vacuum was pulled (for 5-10 minutes) to remove air inclusions and dissolved gases. The PDMS replica was then cured at 70° C. for 5 h and peeled away from the master mold to obtain in patterned stamp form.

Bilayer composite-PDMS structures were used to make stamps from hard silicon master molds bearing high aspect-ratio and densely packed features. The bilayer stamp consists of a patterned thin layer of h-PDMS backed with a thick soft Sylgard 184 PDMS layer, and were made using a method described elsewhere. An h-PDMS layer (see methods) is essential as Sylgard 184 PDMS has insufficient mechanical strength to prevent deformation of high aspect ratio densely packed features. In a typical process to make h-PDMS, 1.7 g of (7.0-8.0% vinylmethylsiloxane)-dimethylsiloxane copolymer(trimethylsiloxyl terminated, VDT-731, Gelest Corp.) was mixed with one drop of 2, 4, 6, 8-tetramethyltetravinylcyclotetrasuloxane (Fluka-87927, Sigma-Aldrich Co. Ltd.) and 9 µl of platinum-divinyltetramethyldisiloxane complex in xylene (SIP-6831, Gelest). The mixing was done in a 25 ml glass vial for 30 s using a magnetic stirrer. The mixture was then immediately degassed on a Schlenk line by pulling vacuum for 1 min. To the degassed mixture, 0.5 ml of (25-30% methylhydrosiloxane)-dimethylsiloxane (hydride terminated, Gelest Corp.) was drop wise added and stirred for 1 min. The h-PDMS mixture was then immediately spin-coated on a patterned silicon master at 1000 RPM for 40 s, followed by heating at 60° C. for 2 min to cure h-PDMS. A ~3 mm-thick layer of Sylgard 184 prepolymer mixture (made as described above) was poured onto the h-PDMS layer and cured at 70° C. for 5 h. The cured bilayer composite-PDMS was then peeled away from the master mold.

Preparation of Nanoparticle Dispersions for Inks.

Solvent exchanged ITO NP dispersions in NMP were obtained by adding NMP to commercially available ITO dispersion in IPA, followed by evaporation of IPA. Equal weights of ITO (~30 wt %, 20-30 nm average particle size, In$_2$O$_3$:SnO$_2$=90:10 by weight) NPs dispersion in IPA (Nanostructured & Amorphous Materials, Inc.) and NMP (N-methyl-2-pyrrolidone 99%, Sigma-Aldrich Co. Ltd.) are mixed and dried under a stream of air to remove IPA. The solid content of ITO in the dispersion obtained after solvent exchange, as determined by heat treating the NP dispersion at 500° C. for 1 h was found to be 25.9 wt %.

To obtain TiO$_2$ NPs dispersion NMP-methanol solvent mixture, acid stabilized titanium oxide (anatase, 15 wt %, 5-30 nm average particle size) NPs dispersion in water (Nanostructured & Amorphous Materials, Inc.) was mixed with NMP and methanol in 2:1:1 weight ratio and dried under a stream of air to remove majority of solvents (up to 50% solvent remaining in the obtained mixture). The resulting dried slurry was redispersed in 1:1 NMP-methanol solvent mixture using vortex-mixing and sonication to obtain 15 wt % TiO$_2$ NPs dispersion, which can be further diluted with methanol in order to adjust the thickness of spin coated films. Solvent exchanging with only NMP caused agglomeration. Addition of methanol upon removal of water improves the dissociation of the acid sufficiently to avoid destabilization of the suspension. Moreover, the NMP-methanol solvent mixture provided high quality spin coated films whereas the NMP-water mixture caused striation in the films.

To obtain ~3 wt % of TiO$_2$ NPs dispersion in propanediol-methanol solvent mixture, one part (by volume) of titanium oxide (anatase, around 20 wt %, 15 nm average particle size) NPs dispersion in 1, 2-propanediol (US Research Nanomaterials, Inc.) was diluted with 5 parts of methanol (ACS grade, Fisher Scientific).

All NPs dispersions were subject to ultrasonication for a few minutes before using as ink.

Preparation of Nanoparticle/Sol Inks.

To prepare NP/sol ITO-ink, an ITO NP dispersion in NMP was mixed with ITO sol in NMP. The ITO sol in NMP was prepared by dissolving 0.235 g of tin (IV) acetate (Sn(CH$_3$CO$_2$)$_4$, Sigma-Aldrich Co. Ltd.) in 6.75 g of NMP at 80° C., followed by solubilizing 3.02 g of indium(III) nitrate hydrate (In(NO$_3$)$_3$.xH$_2$O (x=4.5, as determined by weight loss upon heating in vacuum at 105° C. for 24 h), Sigma-Aldrich Co. Ltd.). This composition of metal slats is chosen to create ITO with In$_2$O$_3$:SnO$_2$=90:10 (by weight) upon calcining the sol at 500° C.

To prepare 80 NP/20 sol TiO$_2$ ink, 15 wt % TiO$_2$ NPs dispersion in NMP-methanol was mixed with titanium diisopropoxide bis(acetylacetonate) (TPA, [(CH$_3$)$_2$CHO]$_2$Ti(C$_5$H$_7$O$_2$)$_2$, 75 wt % in isopropanol, Sigma-Aldrich Co. Ltd.) in proportions to provide 80:20 (by weight) NPs to TPA in the ink.

Characterization of Nanostructures.

Aggregates size distributions in NP dispersions diluted to 5 wt % solids were measured by dynamic light scattering (Malvern Zetasizer 3000 HSa instrument). Transmission electron microscopy was performed in bright field imaging mode using a JEOL 2000 FX TEM operated at an accelerating voltage of 200 kV. The silicon master was gold sputtered using a sputter coater (CR 108) for 60 seconds prior to imaging. Scanning electron microscopy was performed on a field emission scanning electron microscope (Magellan 400). Thickness measurements of planar films were performed with a surface profilometer (Veeco Dektak 150). Sheet resistance of planar ITO films (on SiO$_2$ (300 nm)/Si wafer) were measured using four-point probe technique (Keithley 2400 instrument) with evaporated gold electrodes for contacts. Transmittance measurements of planar films on quartz substrate were performed on UV/VIS/NIR spectrometer (Perkin Elmer Lambda 1050) using integrating sphere accessory. X-ray diffraction (XRD) experiments were performed using X-ray diffractometer (Philips PANalytical X'Pert) equipped with copper Kα X-ray (0.1542 nm) source operating at 45 kV and 40 mA. Average crystallite size by XRD was measured using Scherrer equation. Spectroscopic ellipsometry measurements for determination of refractive index (RI) were performed using variable-angle spectroscopic ellipsometer (RC2-DI from J. W. Woollam Co., Inc.). Ellipsometric data was collected for 55°, 60°, 65° and 70° angles of incidence. RI for ITO was determined by fitting ellipsometric data in 450-1500 nm spectral range with a bilayer model consisting of general oscillator layer on silicon substrate. The fitting was performed using instrument's VASE-software (complete EASE™ version 2.30 software, J.A. Woollam Co., Inc.).RI for TiO$_2$ was determined by fitting ellipsometric data in 380-1500 nm spectral range with a bilayer model consisting of a Cauchy layer on silicon substrate. Porosity was calculated using Lorentz-Lorenz effective medium approximation model as:

$$\frac{n_{eff}^2 - 1}{n_{eff}^2 + 2} = (1-f)\frac{n_c^2 - 1}{n_c^2 + 2}$$

where $n_{eff}$ is the measured RI of the film, f is the volume fraction of the pores (percentage porosity=100xf) and $n_c$ is the RI of dense material in the absence of porosity.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the invention not be limited to the particular embodiment disclosed as the best mode contemplated for carrying out this disclosure.

The terms and expressions that have been employed are used as terms of description and not of limitation, and there is no intention in the use of such terms and expressions of excluding any equivalents of the features shown and described or portions thereof, but it is recognized that various modifications are possible within the scope of the embodiments of the present invention. Thus, it should be understood that although the present invention has been specifically disclosed by specific embodiments and optional features, modification and variation of the concepts herein disclosed may be resorted to by those of ordinary skill in the art, and that such modifications and variations are considered to be within the scope of embodiments of the present invention.

EXEMPLARY EMBODIMENTS

The following exemplary embodiments are provided, the numbering of which is not to be construed as designating levels of importance:

Embodiment 1 provides a method of manufacturing a textured surface comprising: disposing an ink on a substrate, wherein the ink comprises nanoparticles and a sol gel precursor; contacting the ink with a textured mold, wherein the mold is permeable to a solvent present in the ink and is operative to absorb the solvent; transferring a texture from the textured mold to the ink; and annealing the substrate.

Embodiment 2 provides the method of embodiment 1, wherein the texture comprises a 1-dimensional, a 2-dimensional or a 3-dimensional structure, or combinations thereof.

Embodiment 3 provides the method of any one of embodiments 1-2, wherein the annealing is conducted at temperatures of up to 1000° C.

Embodiment 4 provides the method of any one of embodiments 1-3, wherein the annealing is conducted at temperatures of 100 to 500° C. for a period of 5 minutes to 2 hours.

Embodiment 5 provides the method of any one of embodiments 1-4, wherein the contacting of the ink with the textured mold is conducted at a pressure of 0.1 to 5 MPa.

Embodiment 6 provides the method of any one of embodiments 1-5, wherein the mold comprises an elastomer.

Embodiment 7 provides the method of any one of embodiments 1-6, wherein the elastomer comprises at least one of a polysiloxane, a polyurethane, a polybutadiene, a polyisoprene, or a combination thereof.

Embodiment 8 provides the method of any one of embodiments 1-7, wherein the nanoparticles comprise indium titanium oxide, titanium dioxide, aluminum oxide, silicon dioxide, or a combination thereof.

Embodiment 9 provides the method of any one of embodiments 1-8, wherein the nanoparticles comprise a metal oxide, a metal nitride, a metal carbide, a metal oxynitride, a metal oxycarbide, a metal boride, a metal silicide, or a combination thereof.

Embodiment 10 provides the method of any one of embodiments 1-9, wherein the embodiment further comprises disposing a planarization layer of a polymer on the annealed substrate and disposing a second layer of texture on the planarization layer.

Embodiment 11 provides the method of any one of embodiments 1-10, wherein the embodiment further comprises re-annealing the substrate.

Embodiment 12 provides the method of any one of embodiments 1-11, wherein the relative humidity is from about 20% to about 100% during the manufacturing of the textured surface.

Embodiment 13 provides the method of any one of embodiments 1-12, wherein the annealing is conducted by heating or by irradiating with microwave radiation, visible light, infra-red radiation, or ultraviolet radiation.

Embodiment 14 provides the method of any one of embodiments 1-13, wherein the transfer of the texture from the mold to the ink is configured to produce features in the ink that are not connected together by an underlying layer.

Embodiment 15 provides an article comprising a textured surface formed by the method of any one of embodiments 1-14.

Embodiment 16 provides an article comprising: a substrate; and a 1-dimensional, a 2-dimensional or a 3-dimensional structure, or combinations thereof disposed on the substrate, wherein the 1-dimensional, 2-dimensional or 3-dimensional structure is manufactured by a method comprising: disposing an ink on the substrate; wherein the ink comprises nanoparticles and a sol gel precursor; contacting the ink with a textured mold, wherein the mold is permeable to a solvent present in the ink and is operative to absorb the solvent; transferring a texture from the textured mold to the ink; and annealing the substrate.

What is claimed is:

1. A method of manufacturing a textured surface comprising:
   disposing an ink on a substrate, wherein the ink comprises nanoparticles, a sol gel precursor, and a polar organic solvent, comprising pre-wetting the substrate with polar solvent before disposing ink thereon, wherein the substrate comprises silicon, quartz, or poly(vinyl alcohol) (PVA);
   contacting the ink disposed on the substrate with a textured mold, the mold comprising a bilayer composite stamp comprising an elastomer layer comprising soft-PDMS and a pattern layer comprising h-PDMS, wherein the mold is permeable to the polar organic solvent, the mold is operative to absorb the solvent during the contacting, wherein the contacting is performed with sufficient pressure to dewet and squeeze-out the ink from an interface of the textured mold and the substrate, and wherein the pre-wetting the substrate comprises pre-wetting areas of the substrate that form the interface with the textured mold;
   transferring a texture from the textured mold to the ink disposed on the substrate, wherein the transferring occurs during the contacting, and wherein the transferring of the texture forms no residual layer bridging nanopatterns in the transferred texture;
   annealing the substrate;
   disposing a planarization layer comprising an organic polymer on the texture on the annealed substrate;
   repeating the steps of disposing, contacting, transferring, and annealing, to dispose a second texture on the planarization layer, further comprising pre-wetting the planarization layer with polar solvent before disposing ink thereon, wherein the repeated step of contacting comprises contacting with sufficient pressure to dewet and squeeze-out the ink from an interface of the textured mold and the planarization layer, wherein the pre-wetting the planarization layer comprises pre-wetting areas of the planarization layer that form the interface with the textured mold, and wherein the transferring of the second texture forms no residual layer bridging nanopatterns in the second transferred texture; and
   calcining, dissolving, and/or degrading the planarization layer to remove the planarization layer and to form the textured surface.

2. The method of claim 1, wherein the texture comprises a 2-dimensional, a 3-dimensional structure, or combinations thereof.

3. The method of claim 1, wherein the contacting of the ink with the textured mold is conducted at a pressure of 0.1 to 5 MPa.

4. The method of claim 1, wherein the nanoparticles comprise indium tin oxide, titanium dioxide, aluminum oxide, silicon dioxide, or a combination thereof.

5. The method of claim 1, wherein the nanoparticles comprise a metal oxide, a metal nitride, a metal carbide, a metal oxynitride, a metal oxycarbide, a metal boride, a metal silicide, or a combination thereof.

6. The method of claim 1, wherein the relative humidity is from about 20% to about 100% during the manufacturing of the textured surface.

7. The method of claim 1, wherein the annealing is conducted by heating or by irradiating with microwave radiation, visible light, infra-red radiation, or ultraviolet radiation.

8. The method of claim 1, wherein the annealing comprises annealing for 5 minutes to less than 15 minutes.

9. The method of claim 1, wherein the textured surface of the textured, annealed substrate has a refractive index of 1.9 to 2.1 at a wavelength of 633 nm.

10. The method of claim 1, wherein the textured surface of the textured, annealed substrate comprises a high aspect ratio crystalline inorganic oxide and exhibits less than 8% linear shrinkage in imprinted feature height upon heat treatment at 500° C.

11. The method of claim 1, wherein the textured surface is free of organic materials.

12. The method of claim 1, further comprising:
   performing the disposing of the ink on the substrate in an environment having 70-100% relative humidity.

13. The method of claim 1, wherein the annealing is conducted at temperatures of up to 1000° C.

14. The method of claim 13, wherein the annealing is conducted at temperatures of 100 to 500° C. for a period of 5 minutes to 2 hours.

15. The method of claim 1, wherein the mold comprises an elastomer.

16. The method of claim 15, wherein the elastomer comprises a polysiloxane, a polyurethane, a polybutadiene, a polyisoprene, or a combination thereof.

17. The method of claim 1, wherein the method comprises calcining the planarization layer to remove the planarization layer and to form the textured surface.

18. The method of claim 17, wherein the calcining converts the sol-gel precursor into a crystalline phase.

19. A method of manufacturing a textured surface comprising:
- disposing an ink on a substrate, wherein the ink comprises nanoparticles, a sol gel precursor, and a polar organic solvent, comprising pre-wetting the substrate with polar solvent before disposing ink thereon, wherein the substrate comprises silicon, quartz, or poly(vinyl alcohol) (PVA);
- contacting the ink disposed on the substrate with a textured mold, the mold comprising a bilayer composite stamp comprising an elastomer layer comprising soft-PDMS and a pattern layer comprising h-PDMS, wherein the mold is permeable to the polar organic solvent, and the mold is operative to absorb the solvent during the contacting, wherein the contacting is performed with sufficient pressure to dewet and squeeze-out the ink from an interface of the textured mold and the substrate, and wherein the pre-wetting the substrate comprises pre-wetting areas of the substrate that form the interface with the textured mold;
- transferring a texture from the textured mold to the ink disposed on the substrate, wherein the transferring occurs during the contacting, and wherein the transferring of the texture forms no residual layer bridging nanopatterns in the transferred texture; and
- annealing the substrate to form the textured surface.

20. The method of claim 19, further comprising:
- performing the disposing in an environment having 70-100% relative humidity.

* * * * *